United States Patent
Wang et al.

(10) Patent No.: US 11,601,113 B2
(45) Date of Patent: Mar. 7, 2023

(54) BULK ACOUSTIC WAVE/FILM BULK ACOUSTIC WAVE RESONATOR AND FILTER FOR WIDE BANDWIDTH APPLICATIONS

(71) Applicant: SKYWORKS GLOBAL PTE. LTD., Singapore (SG)

(72) Inventors: Yiliu Wang, Irvine, CA (US); Yasufumi Kaneda, Yokohama (JP); Xianyi Li, Irvine, CA (US); Kwang Jae Shin, Yongin (KR); Stephane Richard Marie Wloczysiak, Irvine, CA (US); Jiansong Liu, Irvine, CA (US); Nan Wu, Irvine, CA (US)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 0 days.

(21) Appl. No.: 16/881,285

(22) Filed: May 22, 2020

(65) Prior Publication Data
US 2020/0373911 A1 Nov. 26, 2020

Related U.S. Application Data

(60) Provisional application No. 62/885,454, filed on Aug. 12, 2019, provisional application No. 62/852,831, filed on May 24, 2019.

(51) Int. Cl.
| H03H 9/60 | (2006.01) |
| H03H 9/70 | (2006.01) |
| H03H 9/02 | (2006.01) |
| H03H 9/10 | (2006.01) |
| H03H 9/17 | (2006.01) |

(52) U.S. Cl.
CPC ........ *H03H 9/605* (2013.01); *H03H 9/02157* (2013.01); *H03H 9/1014* (2013.01); *H03H 9/172* (2013.01); *H03H 9/706* (2013.01)

(58) Field of Classification Search
CPC .. H03H 9/605; H03H 9/02157; H03H 9/1014; H03H 9/172; H03H 9/706
See application file for complete search history.

(56) References Cited

U.S. PATENT DOCUMENTS

| 9,385,303 B2 | 7/2016 | Song et al. |
| 11,082,023 B2 | 8/2021 | Shin et al. |

(Continued)

OTHER PUBLICATIONS

Li et al., "Use of double-raised-border structure for quality factor enhancement of type II piston mode FBAR", Microsystem Technologies, Berlin, Germany, vol. 24, No. 7, May 2018, pp. 2991-2997.

*Primary Examiner* — Samuel S Outten
(74) *Attorney, Agent, or Firm* — Lando & Anastasi, LLP

(57) ABSTRACT

A ladder filter comprises a plurality of series arm bulk acoustic wave resonators electrically connected in series between an input port and an output port of the ladder filter and a plurality of shunt bulk acoustic wave resonators electrically connected in parallel between adjacent ones of the plurality of series arm bulk acoustic wave resonators and ground, at least one of the plurality of shunt bulk acoustic wave resonators including raised frame regions having a first width, at least one of the plurality of series arm bulk acoustic wave resonators having one of raised frame regions having a second width less than the first width or lacking raised frame regions.

29 Claims, 20 Drawing Sheets

(56) References Cited

U.S. PATENT DOCUMENTS

| | | | |
|---|---|---|---|
| 2007/0057599 A1 | 3/2007 | Motai et al. | |
| 2008/0024042 A1* | 1/2008 | Isobe | H03H 3/04 310/365 |
| 2010/0013573 A1* | 1/2010 | Umeda | H03H 9/175 333/186 |
| 2012/0200195 A1 | 8/2012 | Yokoyama et al. | |
| 2013/0033337 A1* | 2/2013 | Nishihara | H03H 9/02102 333/133 |
| 2013/0106248 A1 | 5/2013 | Burak et al. | |
| 2013/0193809 A1 | 8/2013 | Araki | |
| 2014/0167566 A1 | 6/2014 | Kando | |
| 2015/0214923 A1* | 7/2015 | Tsuzuki | H03H 9/605 343/850 |
| 2016/0028371 A1 | 1/2016 | Nishihara et al. | |
| 2016/0118958 A1* | 4/2016 | Burak | H03H 9/02157 333/187 |
| 2016/0164487 A1* | 6/2016 | Shin | H03H 9/58 333/189 |
| 2017/0033769 A1* | 2/2017 | Yokoyama | H03H 9/175 |
| 2017/0093374 A1* | 3/2017 | Yatsenko | H03H 9/542 |
| 2017/0214388 A1 | 7/2017 | Irieda et al. | |
| 2018/0013401 A1 | 1/2018 | Lee et al. | |
| 2018/0115302 A1 | 4/2018 | Yeh et al. | |
| 2018/0309427 A1 | 10/2018 | Kim et al. | |
| 2019/0115901 A1* | 4/2019 | Takahashi | H03H 9/564 |
| 2020/0083861 A1 | 3/2020 | Matsuo et al. | |
| 2020/0168785 A1 | 5/2020 | Ikeuchi et al. | |
| 2020/0350888 A1 | 11/2020 | Moulard | |
| 2020/0366266 A1 | 11/2020 | Pollard et al. | |
| 2020/0366271 A1 | 11/2020 | Kim et al. | |
| 2020/0373901 A1 | 11/2020 | Liu et al. | |
| 2021/0028765 A1 | 1/2021 | Wang et al. | |

\* cited by examiner

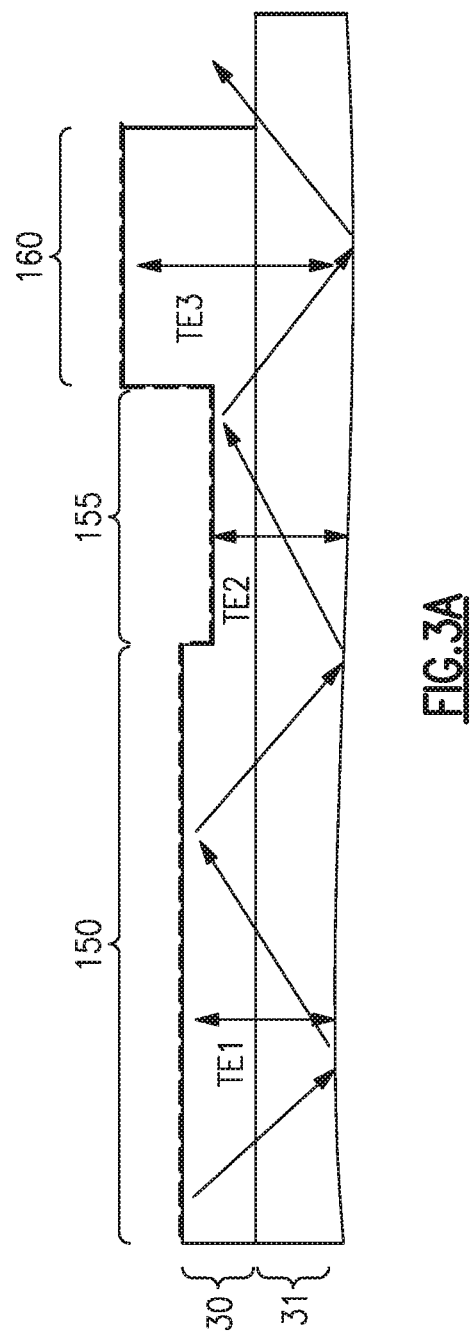

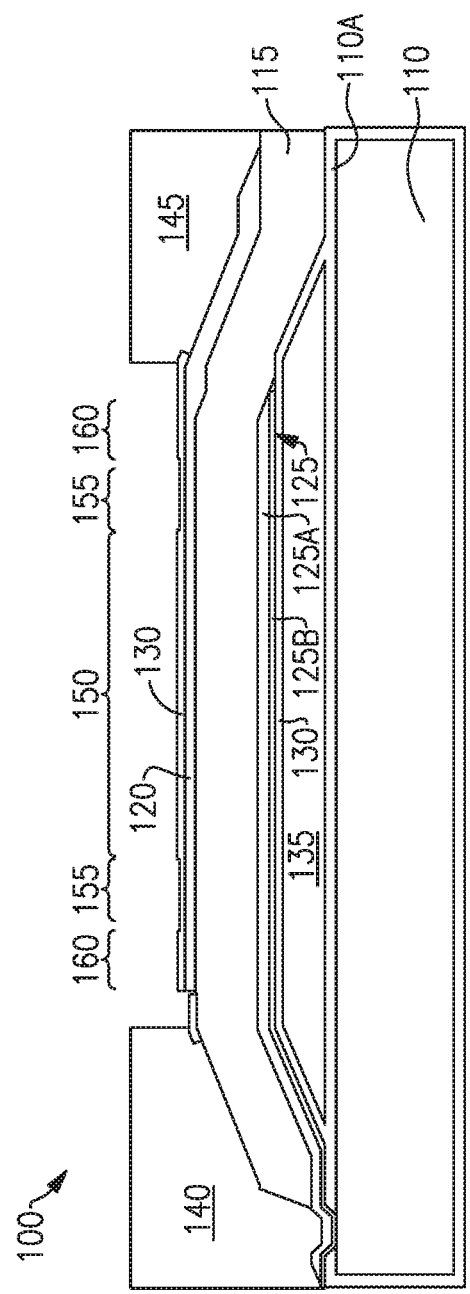
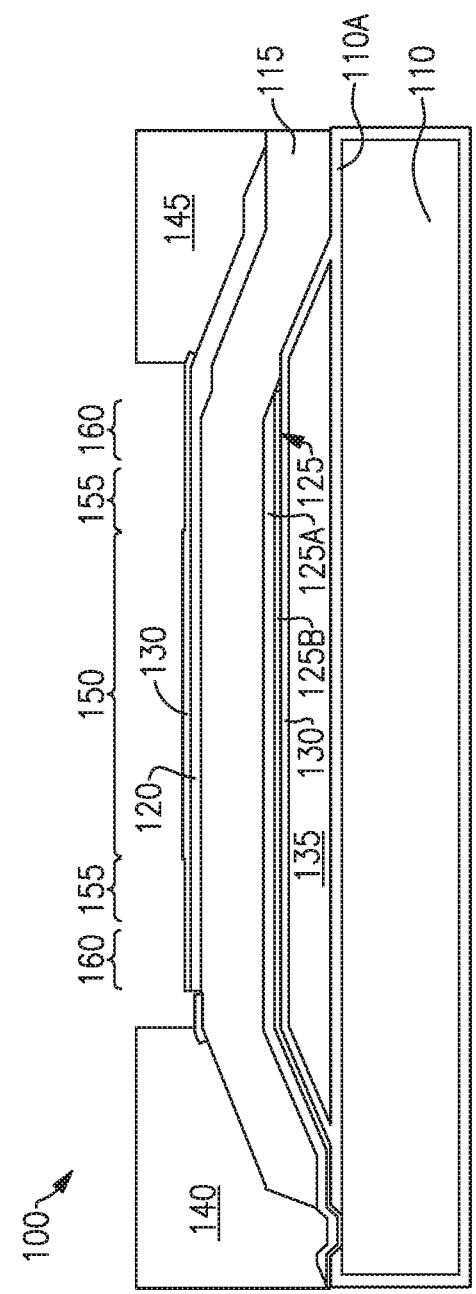
FIG.5A
FIG.5B

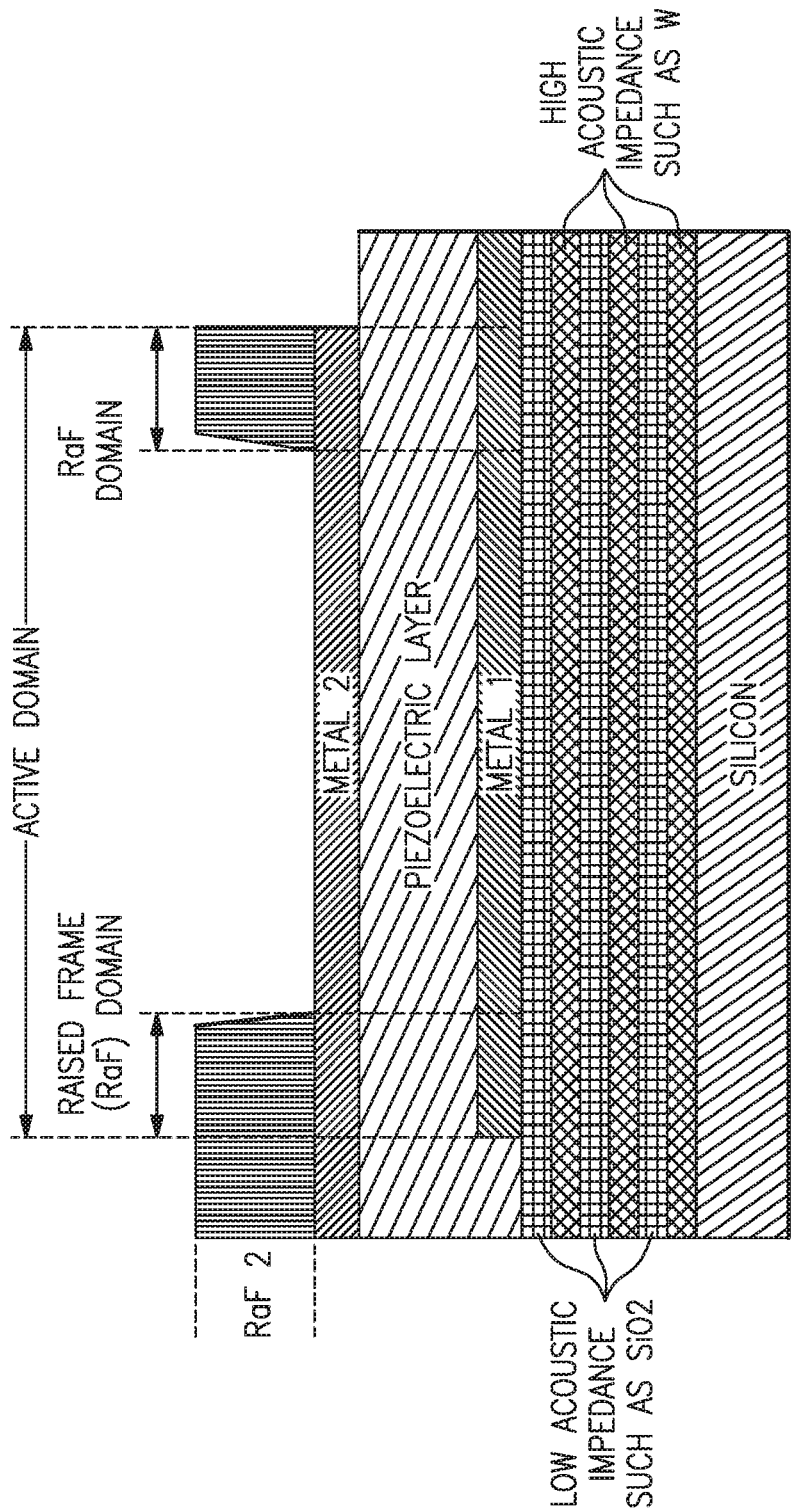

BULK ACOUSTIC WAVE/FILM BULK ACOUSTIC WAVE RESONATOR AND FILTER FOR WIDE BANDWIDTH APPLICATIONS

CROSS-REFERENCE TO RELATED APPLICATIONS

This application claims priority under 35 U.S.C. § 119 (e) to U.S. Provisional Patent Application Ser. No. 62/885,454, filed Aug. 12, 2019 and to U.S. Provisional Patent Application Ser. No. 62/852,831, filed May 24, 2019, each of which is being incorporated herein in its entirety for all purposes.

BACKGROUND

Technical Field

Embodiments of this disclosure relate to acoustic wave devices and structures and methods of mitigating spurious signals in same.

Description of Related Technology

Acoustic wave devices, for example, bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with an aspect, there is provided a ladder filter. The ladder filter comprises an input port and an output port, a plurality of series arm bulk acoustic wave resonators electrically connected in series between the input port and the output port; and a plurality of shunt bulk acoustic wave resonators connected in parallel, each of the shunt bulk acoustic wave resonators being electrically connected between respective adjacent ones of the plurality of series arm bulk acoustic wave resonators and ground, at least one of the plurality of shunt bulk acoustic wave resonators including a raised frame region having a first width, and at least one of the plurality of series arm bulk acoustic wave resonators lacking any raised frame region to thereby increase a bandpass relative to filtering functionality.

In some embodiments, the plurality of series arm bulk acoustic wave resonators are each film bulk acoustic wave resonators.

In some embodiments, the plurality of shunt bulk acoustic wave resonators are each film bulk acoustic wave resonators.

In some embodiments, each of the plurality of series arm film bulk acoustic wave resonators and each of the plurality of shunt film bulk acoustic wave resonators include a piezoelectric film disposed in a central region defining a main active domain in which a main acoustic wave is generated during operation, and in a recessed frame region circumscribing the central region.

In some embodiments, each of the plurality of shunt film bulk acoustic wave resonators include a raised frame region disposed on opposite sides of the recessed frame region from the central region.

In some embodiments, the raised frame region of each of the plurality of shunt film bulk acoustic wave resonators have approximately a same width.

In some embodiments, at least one of the plurality of shunt film bulk acoustic wave resonators has a raised frame region with a width less than a width of raised frame regions of others of the plurality of shunt film bulk acoustic wave resonators.

In some embodiments, each of the plurality of series arm film bulk acoustic wave resonators lack raised frame regions.

In some embodiments, each of the plurality of series arm film bulk acoustic wave resonators have a same resonant frequency.

In some embodiments, each of the plurality of shunt film bulk acoustic wave resonators have a resonant frequency below the resonant frequency of each of the plurality of series arm film bulk acoustic wave resonators.

In some embodiments, at least one of the plurality of shunt film bulk acoustic wave resonators has a first resonant frequency different from resonant frequencies of others of the plurality of shunt film bulk acoustic wave resonators.

In some embodiments, at least one of the plurality of shunt film bulk acoustic wave resonators has a second resonant frequency different from the first resonant frequency and different from the resonant frequencies of others of the plurality of shunt film bulk acoustic wave resonators.

In some embodiments, the ladder filter exhibits a greater insertion loss at an upper end of a passband of the ladder filter than at a lower end of the passband of the ladder filter.

In some embodiments, the ladder filter has a passband in a radio frequency band. The passband may be greater than about 200 MHz in width.

In some embodiments, the ladder filter exhibits a relative passband width wider than 5.5%, the relative passband width being defined as the filter bandwidth divided by the filter center frequency.

In some embodiments, plurality of series arm bulk acoustic wave resonators includes at least one solidly mounted resonator.

In some embodiments, the plurality of shunt bulk acoustic wave resonators includes at least one solidly mounted resonator.

In accordance with another aspect, there is provided a ladder filter. The ladder filter comprises an input port and an output port, a plurality of series arm bulk acoustic wave resonators electrically connected in series between the input port and the output port, and a plurality of shunt bulk acoustic wave resonators connected in parallel, each of the shunt bulk acoustic wave resonators being electrically connected between respective adjacent ones of the plurality of series arm bulk acoustic wave resonators and ground, at least one of the plurality of shunt bulk acoustic wave resonators including a raised frame region having a first width, and at least one of the plurality of series arm bulk acoustic wave resonators including a raised frame region having a second width less than the first width to thereby increase a bandpass relative to filtering functionality.

In some embodiments, the plurality of series arm bulk acoustic wave resonators includes at least one film bulk acoustic wave resonator.

In some embodiments, the plurality of shunt bulk acoustic wave resonators includes at least one film bulk acoustic wave resonator.

In some embodiments, the plurality of series arm bulk acoustic wave resonators includes at least one solidly mounted resonator.

In some embodiments, the plurality of shunt bulk acoustic wave resonators includes at least one solidly mounted resonator.

In accordance with another aspect, there is provided an electronics module comprising a radio frequency ladder filter. The radio frequency ladder filter includes a plurality of series arm film bulk acoustic wave resonators electrically connected in series between an input port and an output port of the ladder filter, and a plurality of shunt film bulk acoustic wave resonators electrically connected in parallel between adjacent ones of the plurality of series arm film bulk acoustic wave resonators and ground, at least one of the plurality of shunt film bulk acoustic wave resonators including a raised frame region having a first width, at least one of the plurality of series arm film bulk acoustic wave resonators having one of a raised frame region having a second width less than the first width or lacking any raised frame region.

In accordance with another aspect, there is provided an electronic device comprising an electronics module including a radio frequency ladder filter. The radio frequency ladder filter includes a plurality of series arm film bulk acoustic wave resonators electrically connected in series between an input port and an output port of the ladder filter, and a plurality of shunt film bulk acoustic wave resonators electrically connected in parallel between adjacent ones of the plurality of series arm film bulk acoustic wave resonators and ground, at least one of the plurality of shunt film bulk acoustic wave resonators including raised a frame region having a first width, at least one of the plurality of series arm film bulk acoustic wave resonators having one of a raised frame region having a second width less than the first width or lacking any raised frame region.

In accordance with another aspect, there is provided a film bulk acoustic wave resonator comprising a piezoelectric film disposed in a central region defining a main active domain in which a main acoustic wave is generated during operation, and in a recessed frame region circumscribing the central region, the film bulk acoustic wave resonator lacking any raised frame region.

In accordance with another aspect, there is provided a radio frequency filter comprising a film bulk acoustic wave resonator including a piezoelectric film disposed in a central region defining a main active domain in which a main acoustic wave is generated during operation, and in a recessed frame region circumscribing the central region, the film bulk acoustic wave resonator lacking any raised frame region.

In accordance with another aspect, there is provided an electronics module comprising a radio frequency filter including a film bulk acoustic wave resonator having a piezoelectric film disposed in a central region defining a main active domain in which a main acoustic wave is generated during operation, and in a recessed frame region circumscribing the central region, the film bulk acoustic wave resonator lacking any raised frame region.

In accordance with another aspect, there is provided an electronic device comprising an electronics module including a radio frequency filter having a film bulk acoustic wave resonator with a piezoelectric film disposed in a central region defining a main active domain in which a main acoustic wave is generated during operation, and in a recessed frame regions circumscribing the central region, the film bulk acoustic wave resonator lacking any raised frame region.

BRIEF DESCRIPTION OF THE DRAWINGS

Embodiments of this disclosure will now be described, by way of non-limiting example, with reference to the accompanying drawings.

FIG. 3A is a highly schematic cross-sectional illustration of a portion of a film bulk acoustic wave resonator;

FIG. 5A is a cross-section of an example of a film bulk acoustic wave resonator without raised frame regions;

FIG. 5B is a cross-section of another example of a film bulk acoustic wave resonator without raised frame regions;

FIG. 9A is a cross-sectional view of an example of a solidly mounted resonator;

DETAILED DESCRIPTION OF CERTAIN EMBODIMENTS

Figure 1:
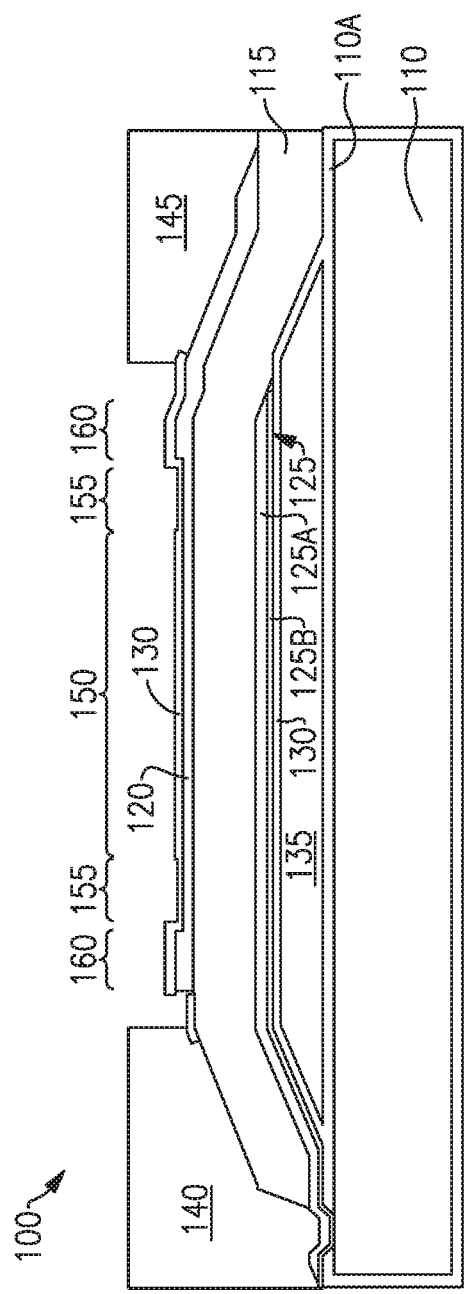
FIG. 1 is a cross-sectional view of an example of a film bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators (FBARs) are a form of bulk acoustic wave resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A FBAR exhibits a frequency response to applied signals with a resonance peak determined by a thickness of the film of piezoelectric material. Ideally, the only acoustic wave that would be generated in a FBAR is a main acoustic wave that would travel through the film of piezoelectric material in a direction perpendicular to layers of conducting material forming the top and bottom electrodes. The piezoelectric material of a FBAR, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the FBAR from what is expected or from what is intended and are generally considered undesirable.

FIG. 1 is cross-sectional view of an example of a FBAR, indicated generally at 100. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru). The bottom electrode 125 may include a layer 125A of Ru disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The FBAR 100 may include a central region 150 including a main active domain in the layer or film of piezoelectric material 115 in which a main acoustic wave is excited during operation. A recessed frame region or regions 155 may bound and define the lateral extent of the central region 150. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150 and/or the difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. A raised frame region or regions 160 may be defined on an opposite side of the recessed frame region(s) 155 from the central region 150 and may directly abut the outside edge(s) of the recessed frame region(s) 155. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. The raised frame region(s) may be, for example, 4 μm or more in width.

The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

It should be appreciated that the FBAR illustrated in FIG. 1 and the FBARs and other structures illustrated in the other figures accompanying this disclosure are illustrated in a highly simplified form. The relative dimensions of the different features are not shown to scale. Further, embodiments of FBARs may include additional features or layers not illustrated or may lack one or more features or layers illustrated herein.

FBARs or other acoustic wave resonators may be combined to form a filter structure that may operate in the radio frequency (RF) band. One type of an acoustic wave resonator-based RF filter is known as a ladder filter. One example of a ladder filter is illustrated in FIG. 2A. The filter of FIG. 2A includes a plurality of acoustic wave resonators R1, R2, R3, R4, R5, R6, R7, R8, R9, R10, and R11 disposed in a series arm between an input port (IN) and an output port (OUT). Resonators R1, R3, R5, R7, R9, and R11 are connected in series between the input port and output port. Resonators R2, R4, R6, R8, and R10 are connected in parallel between resonators R1, R3, R5, R7, and R9 and ground. Resonators R2, R4, R6, R8, and R10 may also be referred to as shunt resonators. In some embodiments, each of the series resonators R1, R3, R5, R7, R9, and R11 may have the same resonant frequency. In some embodiments, each of the plurality of shunt resonators R2, R4, R6, R8, and R10 have a resonant frequency below the resonant frequency of each of the series arm resonators R1, R3, R5, R7, and R9, and R11. At least one of the plurality of shunt resonators R2, R4, R6, R8, and R10 may have a first resonant frequency different from resonant frequencies of others of the plurality of shunt resonators. At least one of the plurality of shunt resonators R2, R4, R6, R8, and R10 may have a second resonant frequency different from the first resonant frequency and different from the resonant frequencies of others of the plurality of shunt resonators.

For ultrawide bandwidth filter implementations, for example, B41 full band (2496 MHz-2690 MHz, a 7.5% relative bandwidth RBW), because the filter passband is so wide, the series resonators in a ladder filter for such implementations should desirably exhibit high admittance (e.g., the Y21 filter parameter) not only at the resonant frequency of the series resonators fs, but also at frequencies below, for example, 100 MHz, 120 MHz, or more below fs. A ladder filter as disclosed herein may have an RBW wider than 5.5% or wider than 7.5% to facilitate use in ultrawide bandwidth filter implementations. Typical FBAR resonators, for example, as illustrated in FIG. 1 may exhibit a degradation in admittance that is larger than desirable at frequencies below, for example, 100 MHz or more below fs and may thus not provide optimal functionality for filters intended for use in ultrawide bandwidth implementations, for example, for filters for the B41 full band. It has been discovered that the raised frame structure in a conventional FBAR may help increase the quality factor Q of the resonator but may degrade the admittance of the resonator at frequencies below fs of the resonator. A conventional raised frame structure may improve Y21 performance close to the fs of a FBAR, but not in a frequency range 100 MHz or more lower than the fs of the FBAR.

Figure 3C:
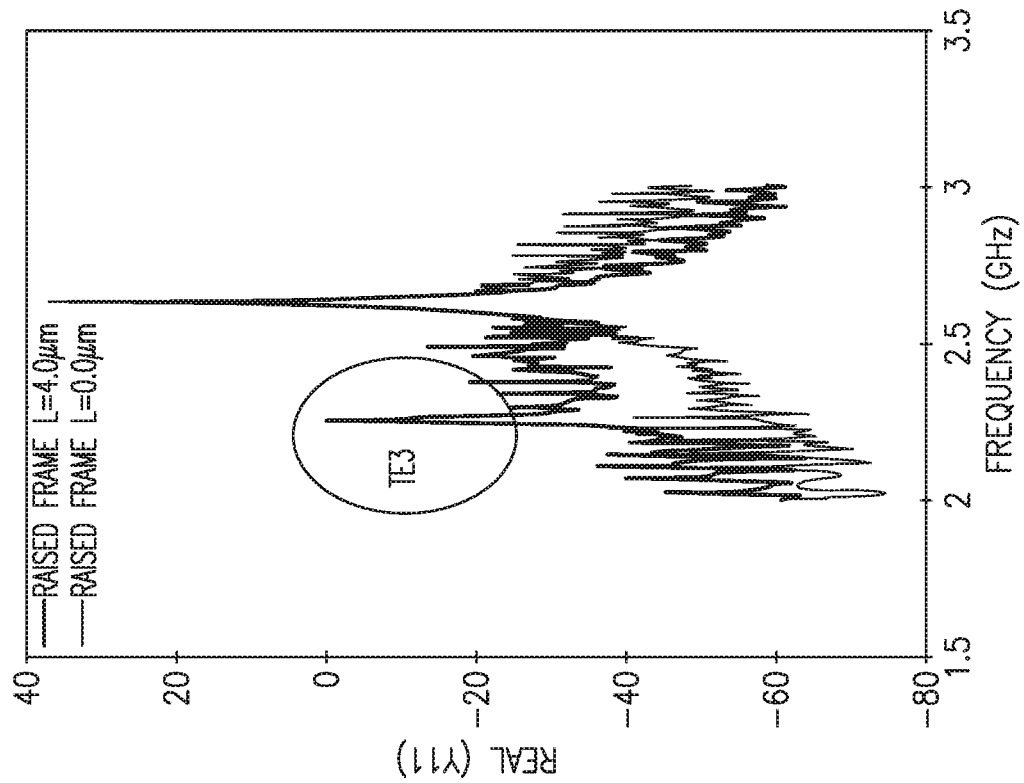
FIG. 3C illustrates curves of admittance in another portion of the film bulk acoustic wave resonator of FIG. 3A with and without a raised frame region.
Figure 3B:
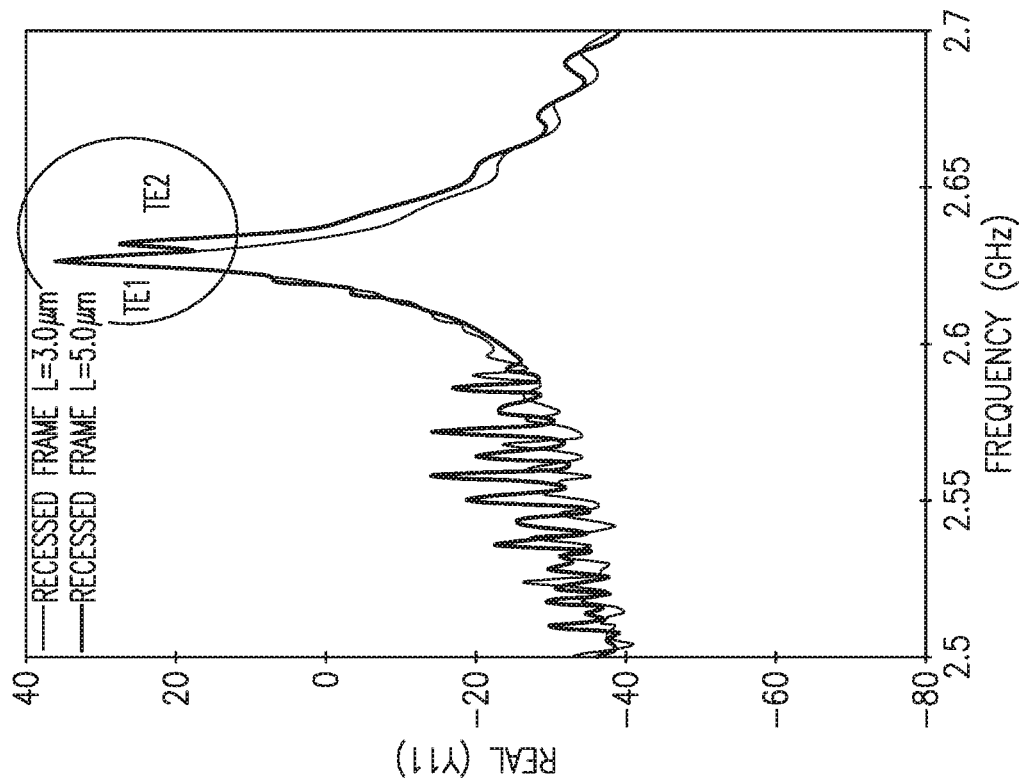
FIG. 3B illustrates curves of admittance in first portions of the film bulk acoustic wave resonator of FIG. 3A with and without a raised frame region.

It has been found that spurious signals in the admittance of a FBAR including a raised frame region may be generated in the raised frame region. In one example, the admittance curves of an example FBAR were simulated at measurement locations TE1, TE2, and TE3 in the central region 150, recessed frame region 155, and raised frame region 160, respectively, as illustrated in FIG. 3A. In FIG. 3A upper region 30 represents a region including frames and may include the top electrode 120 and top dielectric material layer 130. Lower region 31 represents a region of the FBAR not including frames and may include film of piezoelectric material 115 and bottom electrode 125. The simulated example FBAR exhibited spurious signals below the resonant frequency, for example, from about 2.5 GHz to about 2.6 GHz in the central region 150 and recessed frame region 155 that increased in amplitude as the width of the recessed frame region was increased from 3 μm to 5 μm as illustrated in FIG. 3B. A secondary admittance peak also appeared above the resonant frequency of the FBAR as the width of the recessed frame region was increased from 3 μm to 5 μm. As illustrated in the FIG. 3C, in the raised frame region 160, spurious signals in the admittance appeared from about 2 GHz to just below the resonant frequency (about 2.63 GHz) when a raised frame region with a width of 4 μm was present. These spurious signals were substantially suppressed when the FBAR was simulated with no raised frame region (raised frame region width=0 μm), although some spurious signals appeared above the resonant frequency in the FBAR with no raised frame region. The spurious signals above the resonant frequency in the FBAR with no raised frame region were lower in amplitude than the spurious signals below the resonant frequency in the simulated FBAR with the raised frame region with a width of 4 μm.

Figure 2:
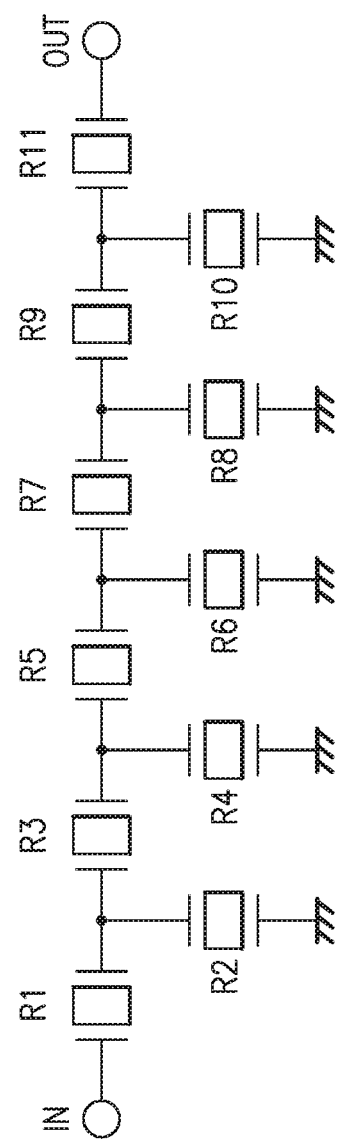
FIG. 2 illustrates an example of a ladder filter.
Figure 4A:
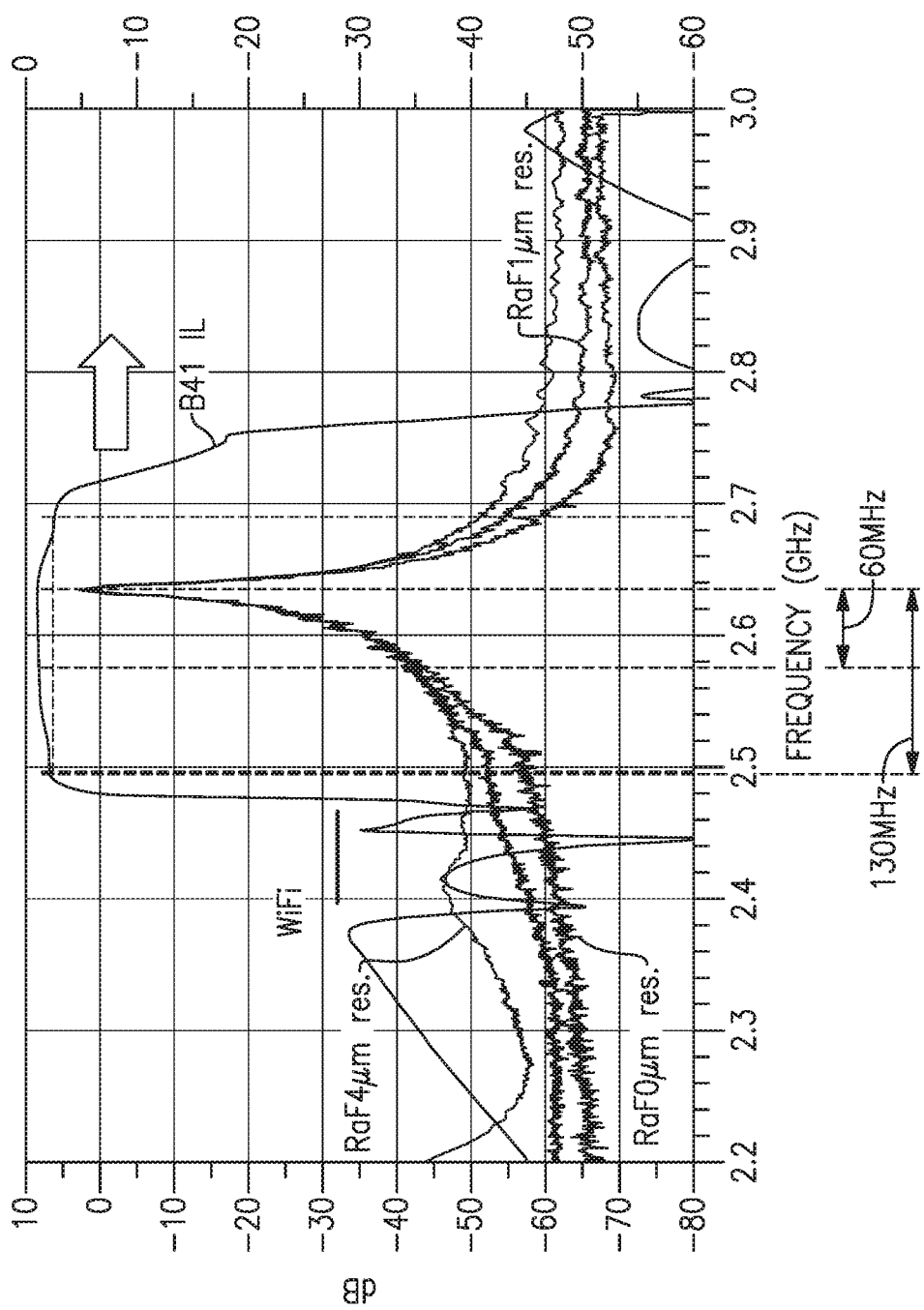
FIG. 4A illustrates insertion loss of a ladder filter configured as illustrated in FIG. 2 with different raised frame region widths in the series resonators of the filter, on which is superimposed the passband of the B41 frequency band.

FIG. 4A is a chart that illustrates the effect on insertion loss IL or admittance for a filter similar to that illustrated in FIG. 2 in which the B41 frequency band passband, with a low channel 130 MHz below the resonant frequency of the serial resonators, is superimposed on the chart. The WiFi frequency band is also illustrated in FIG. 4A to illustrate its proximity to the B41 frequency band. As can be seen in FIG. 4A, the insertion loss was about −50 db at the low end of the B41 passband when the series resonators of the filter included raised frame regions 4 μm wide (Raf4um res. Curve). The insertion loss at the low end of the B41 passband decreased by a couple decibels as the raised frame regions of the series resonators of the filter were reduced to 1 μm in width (RaF1um res. curve) and decreased further to just above −60 db when the raised frame regions of the series resonators were removed (RaF0um res. curve). At the high end of the B41 passband the insertion loss increased from about −60 db, to about −55 dB, to about −50 dB as the width of the raised frame regions of the series resonators of the filter were decreased from 4 μm to 1 μm to 0 μm, respectively.

Figure 4B:
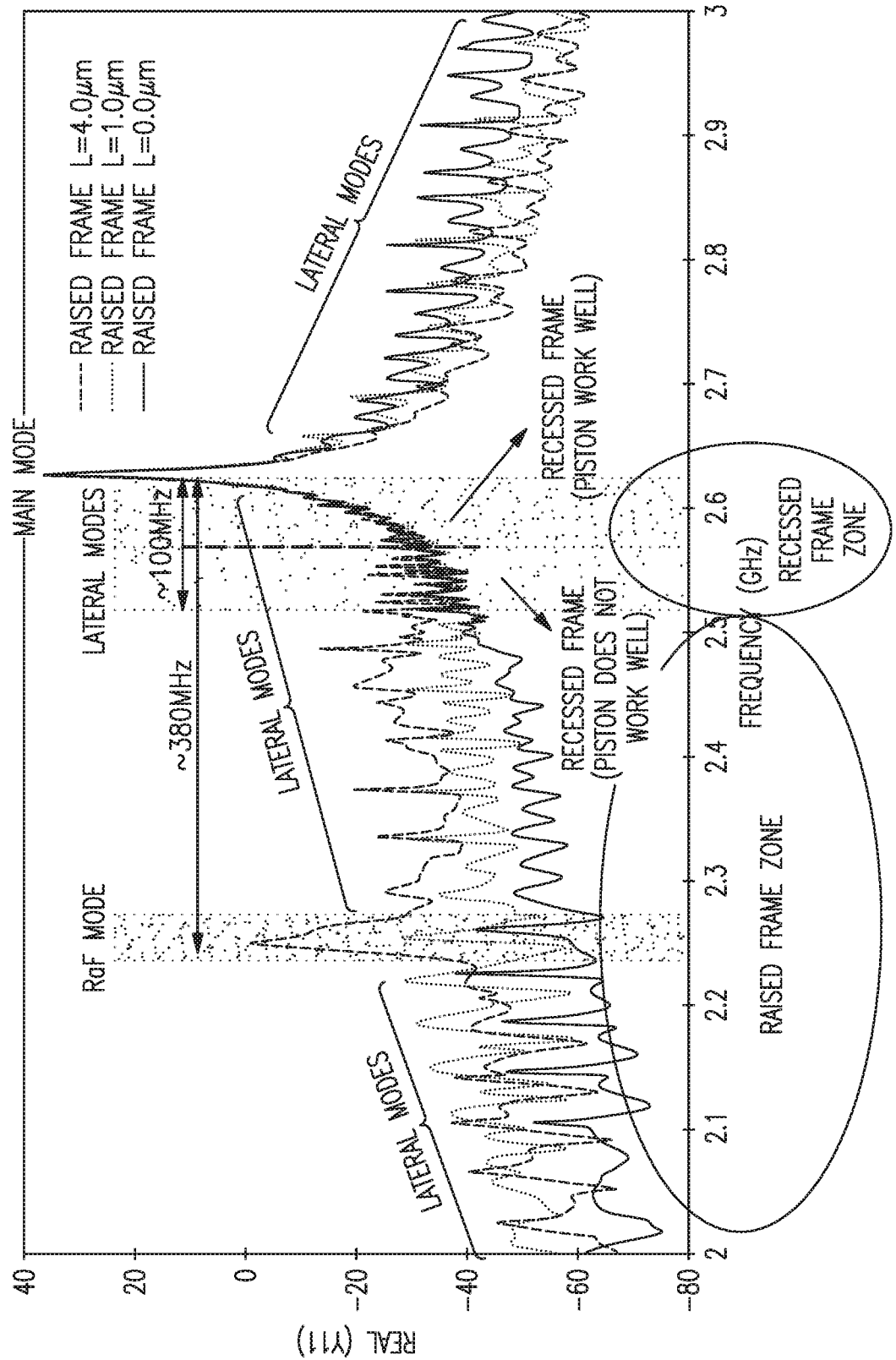
FIG. 4B illustrates contributions of lateral modes and raised frames in the series resonators of a ladder filter as illustrated in FIG. 2B to spurious signals in the admittance curve of the filter.

It should be noted that the spurious signals in the insertion loss curve may include contributions from both lateral mode spurious signals and spurious signals caused by the raised frame. An example of the relative contribution of these different sources of spurious signals for an FBAR with different raised frame widths is illustrated in FIG. 4B.

Although the recessed frame widths and raised frame widths are indicated above as absolute lengths with dimensions of μm, the recessed frame widths and raised frame widths may alternatively be expressed as dimensionless relative widths wherein the widths are expressed as a multiple of the wavelength λ of an acoustic wave in the piezoelectric material of the resonators at the resonant frequency of the main vibrational mode of the resonator.

Figure 4C:
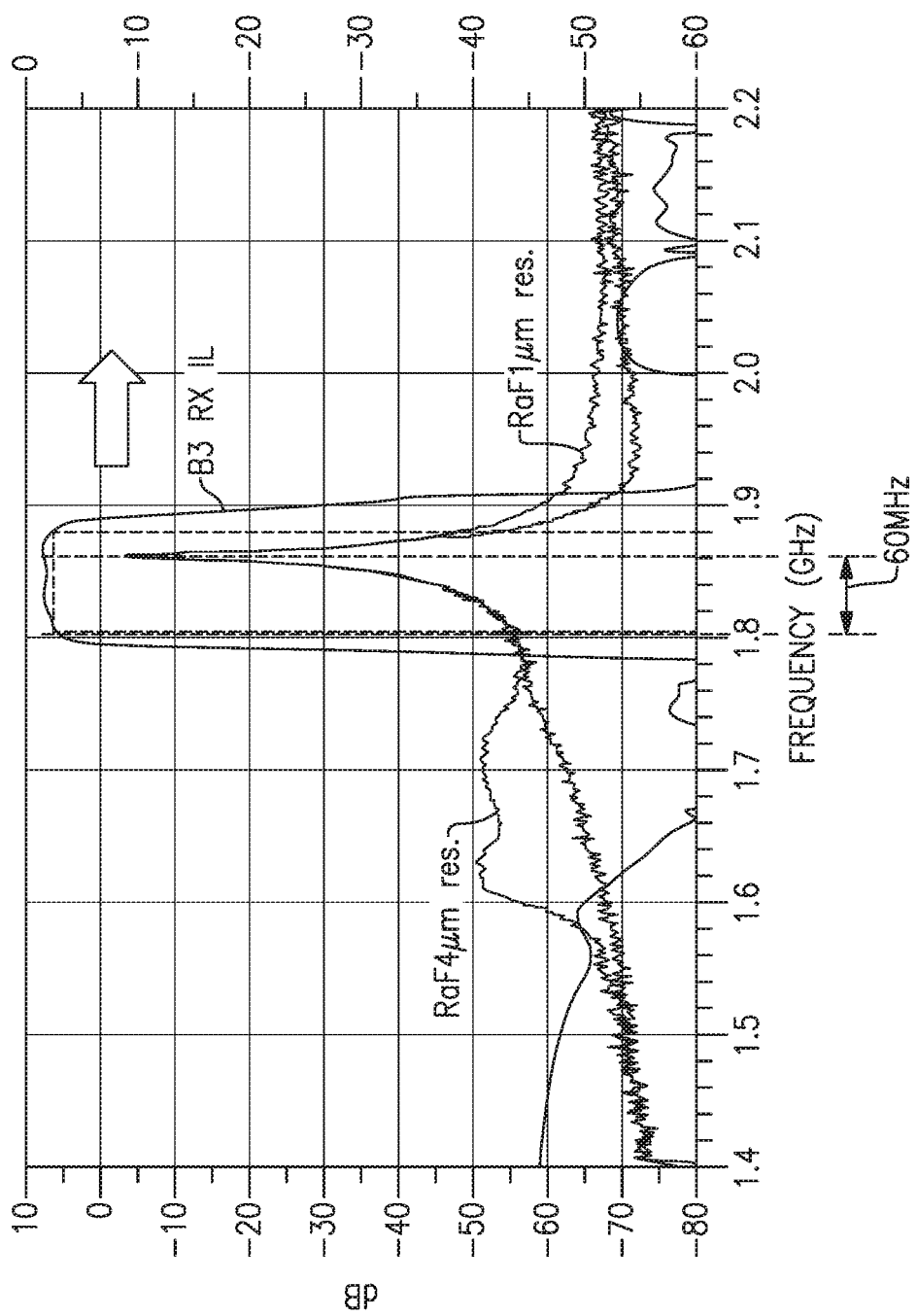
FIG. 4C illustrates insertion loss of a ladder filter configured as illustrated in FIG. 2 with different raised frame region widths in the series resonators of the filter, on which is superimposed the pass band of the B3 receive frequency band.

In a comparative example, FIG. 4C is a chart that illustrates the effect on insertion loss IL or admittance for a filter similar to that illustrated in FIG. 2 in which the B3Rx frequency band passband, with a low channel 60 MHz below the resonant frequency of the serial resonators, is superimposed on the chart. In this comparative example, changing the width of the raised frame regions of the series resonators of the filter has a negligible effect on insertion loss at the low end of the passband, although the insertion loss at the upper end of the passband increases. This illustrates why it is more important to reduce the width of, or eliminate, the raised frame regions of series resonators in ladder filters for ultra-high bandwidth implementations rather than lower bandwidth implementations.

FIG. 5A illustrates a cross section of a FBAR similar to that of FIG. 1, but with the raised frame regions 160 removed (RaF=0 μm). Indicators 160 are still illustrated in FIG. 5A to show where the raised frame regions were present in the FBAR illustrated in FIG. 1. As can be seen by comparing the FBAR structure of FIG. 1 to that FBAR structure of FIG. 5A, the raised regions of the top electrode 120 in regions 160 have been removed in the FBAR structure of FIG. 5A. The top electrode 120 may have a substantially or fully same thickness throughout regions 150, 155, and 160 in the FBAR without raised frame regions illustrated in FIG. 5A. The silicon dioxide layer 130 may have the same thickness in regions 150 and 160 as illustrated in FIG. 5A, or alternatively, may have the same thickness in regions 155 and 160, that is thinner than the thickness in region 150, as illustrated in FIG. 5B.

Figure 6A:
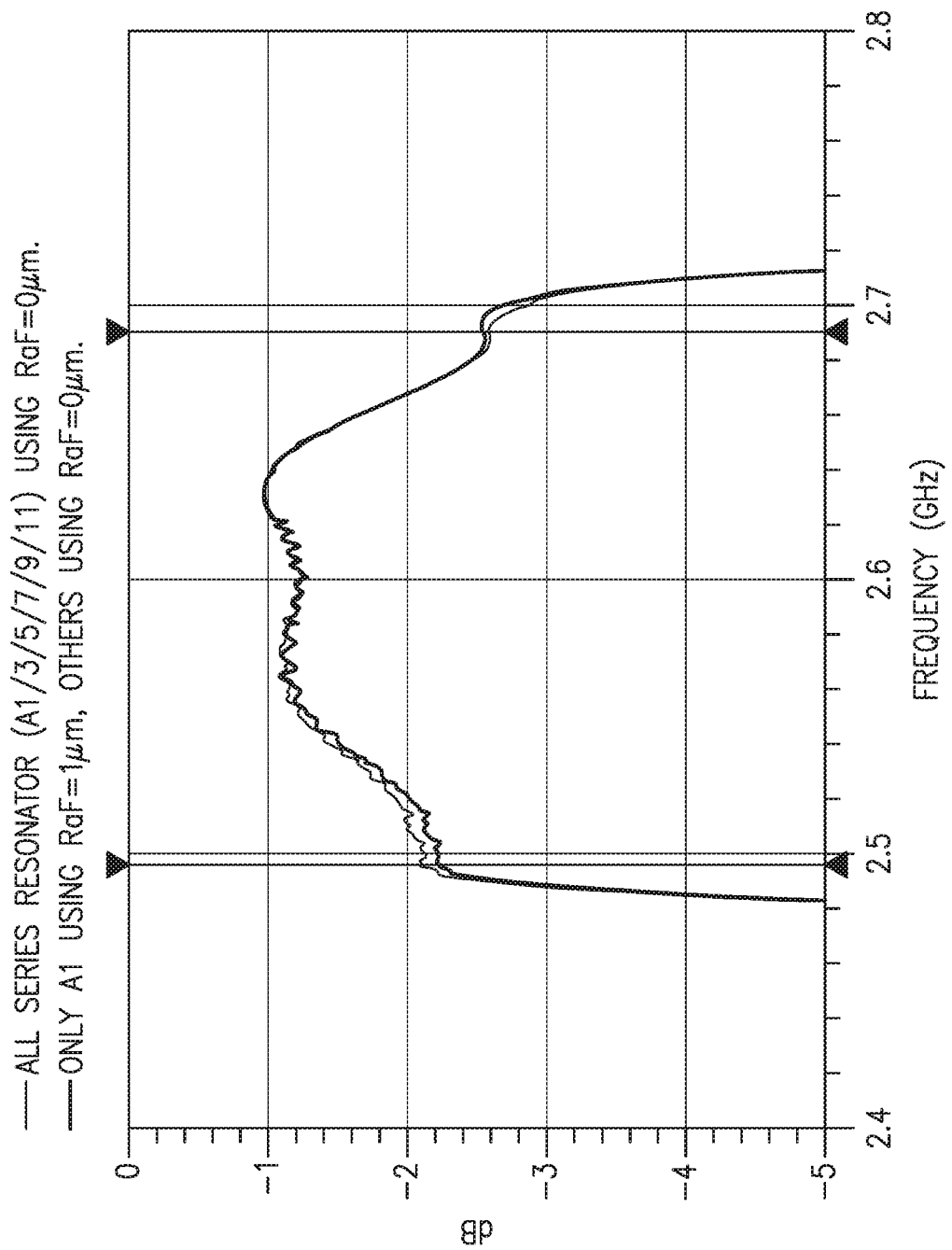
FIGS. 6A-6F illustrate the effect on the passband of a ladder filter as illustrated in FIG. 2 with different of the series resonators including or lacking raised frame regions.
Figure 6B:
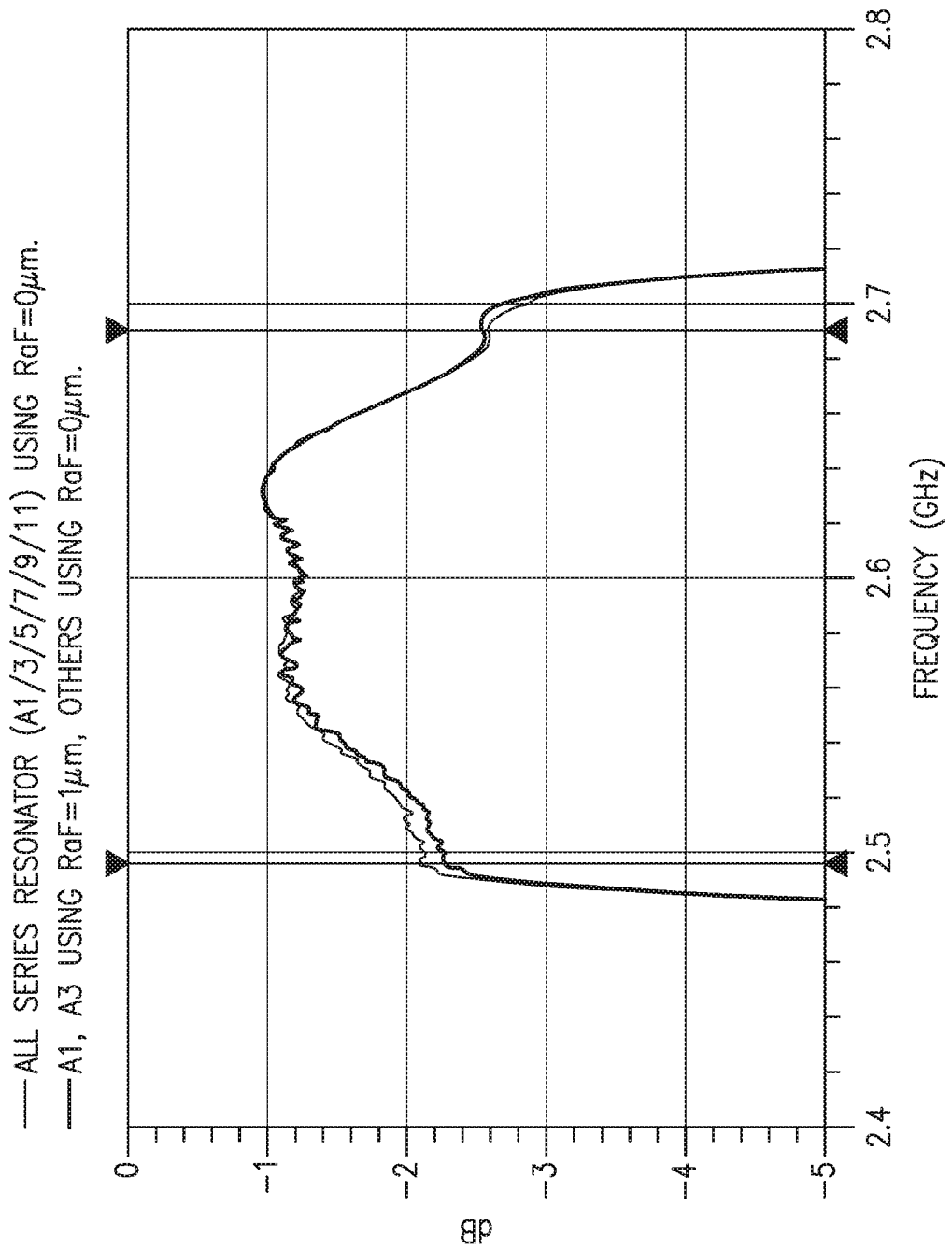
Figure 6C:
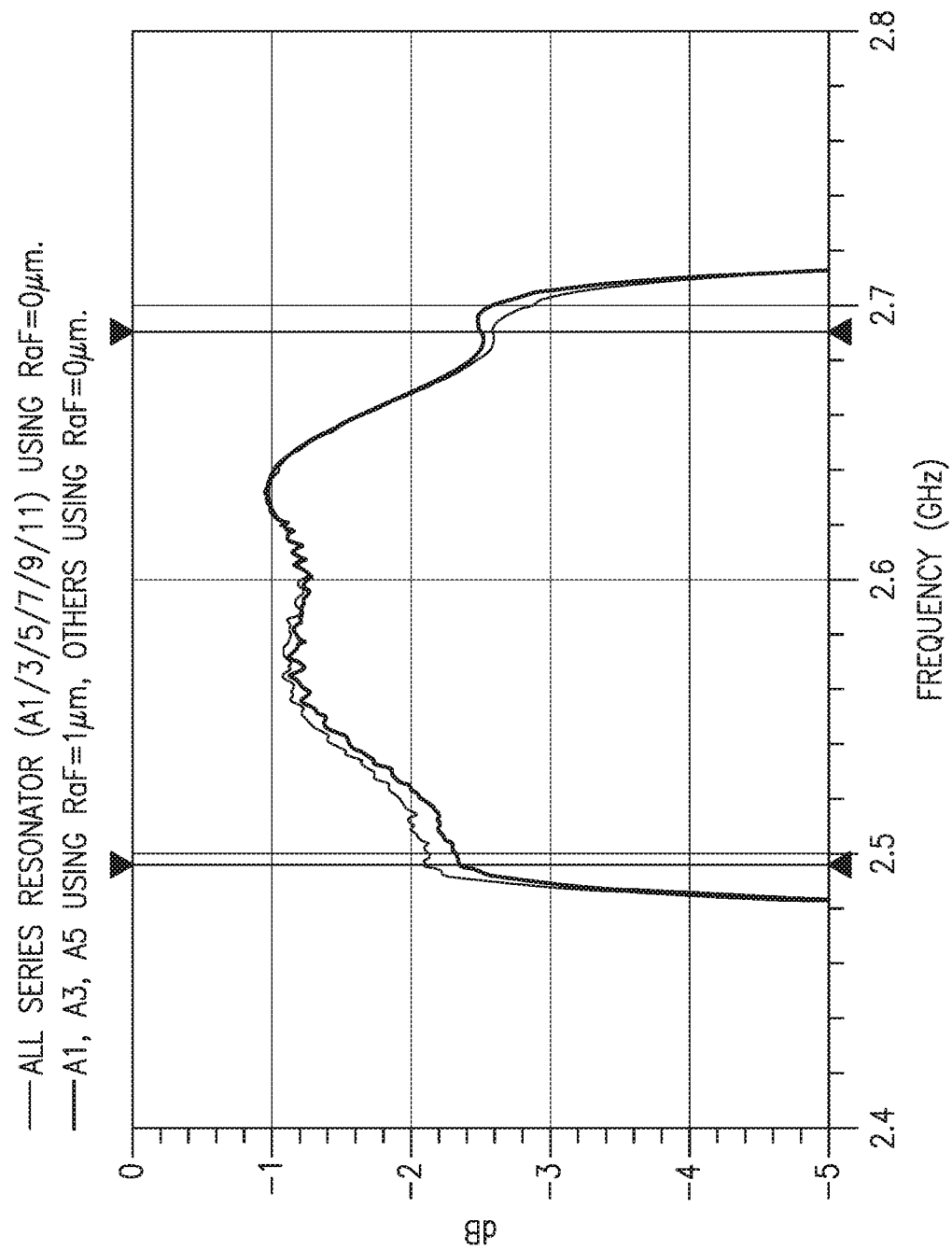
Figure 6D:
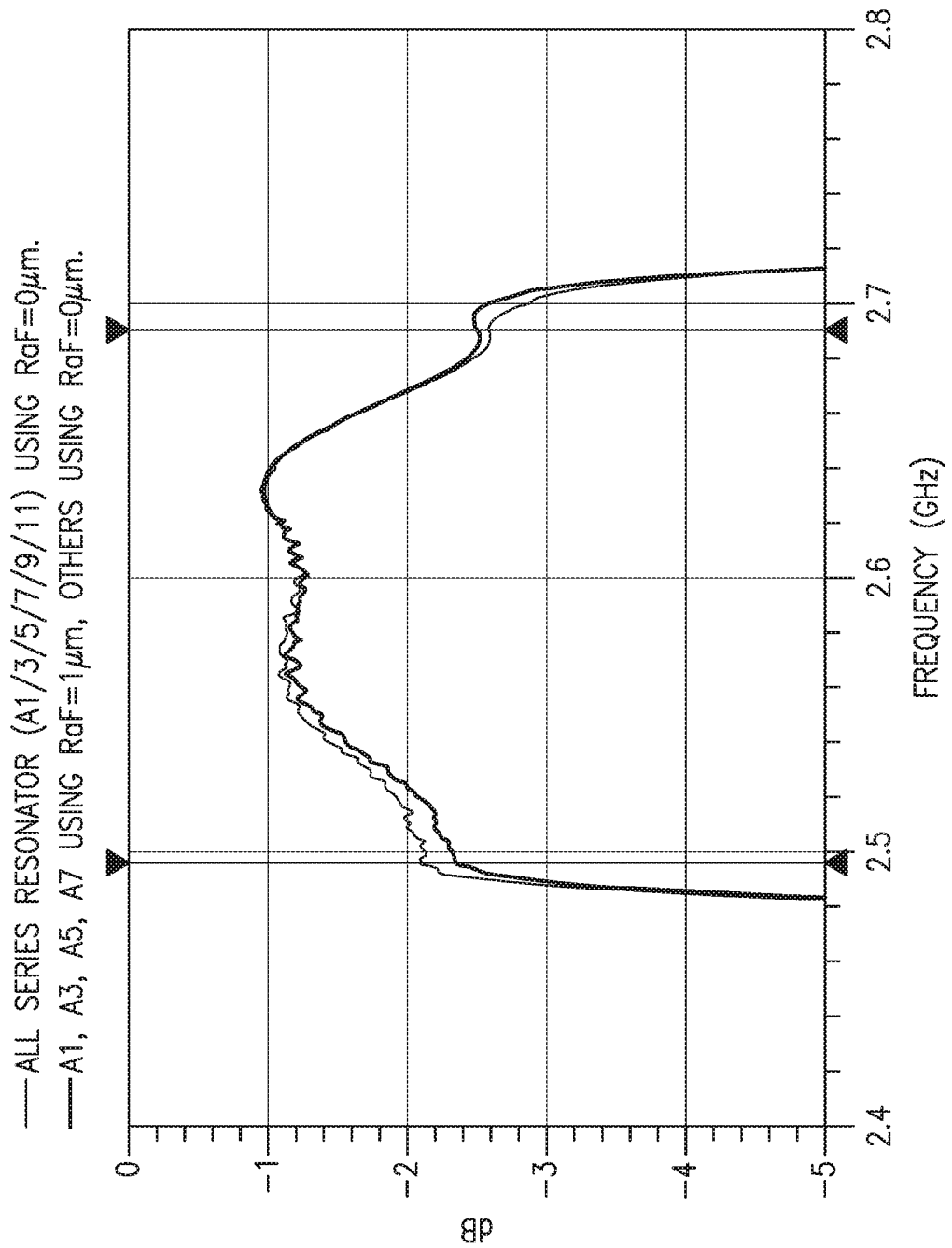
Figure 6E:
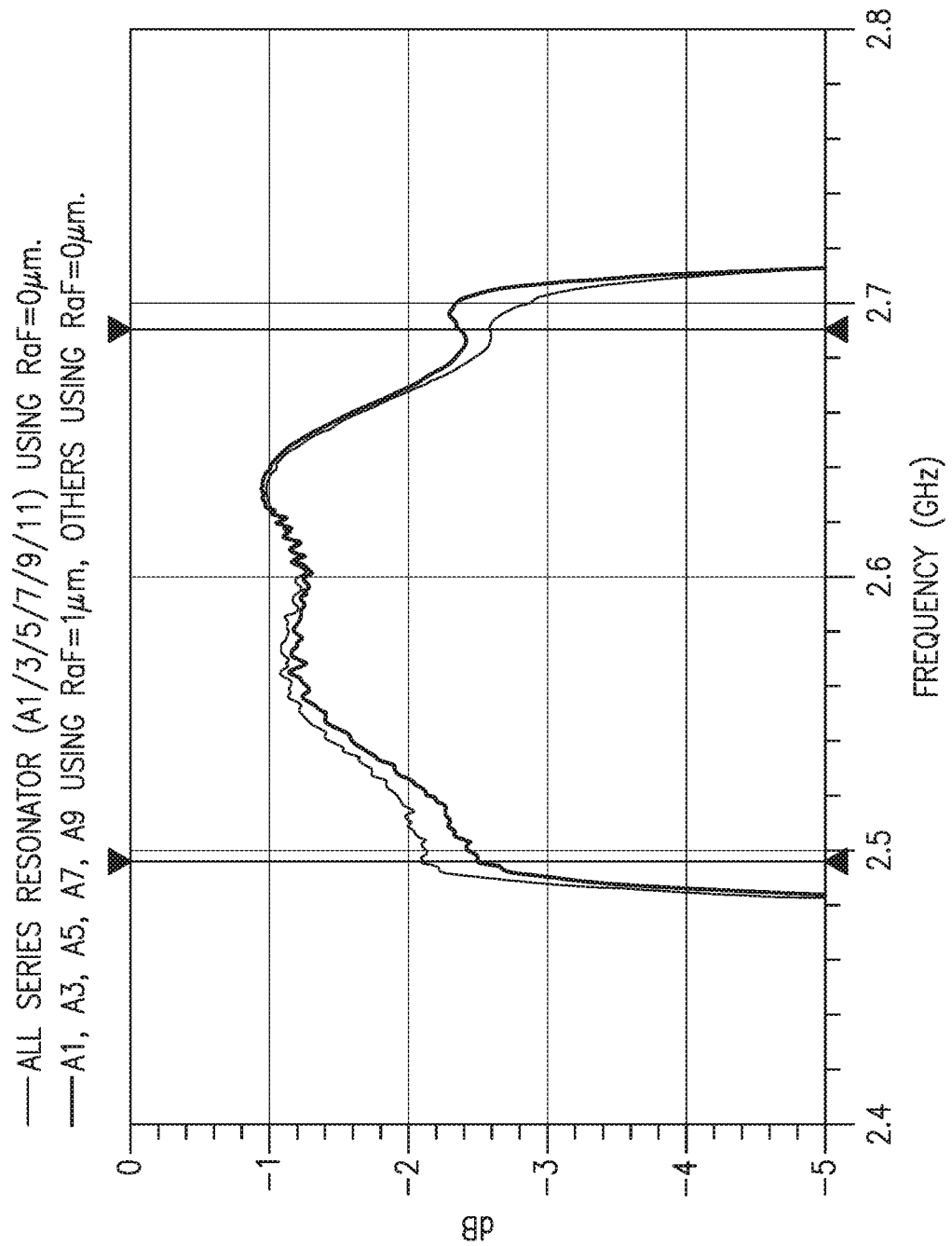
Figure 6F:
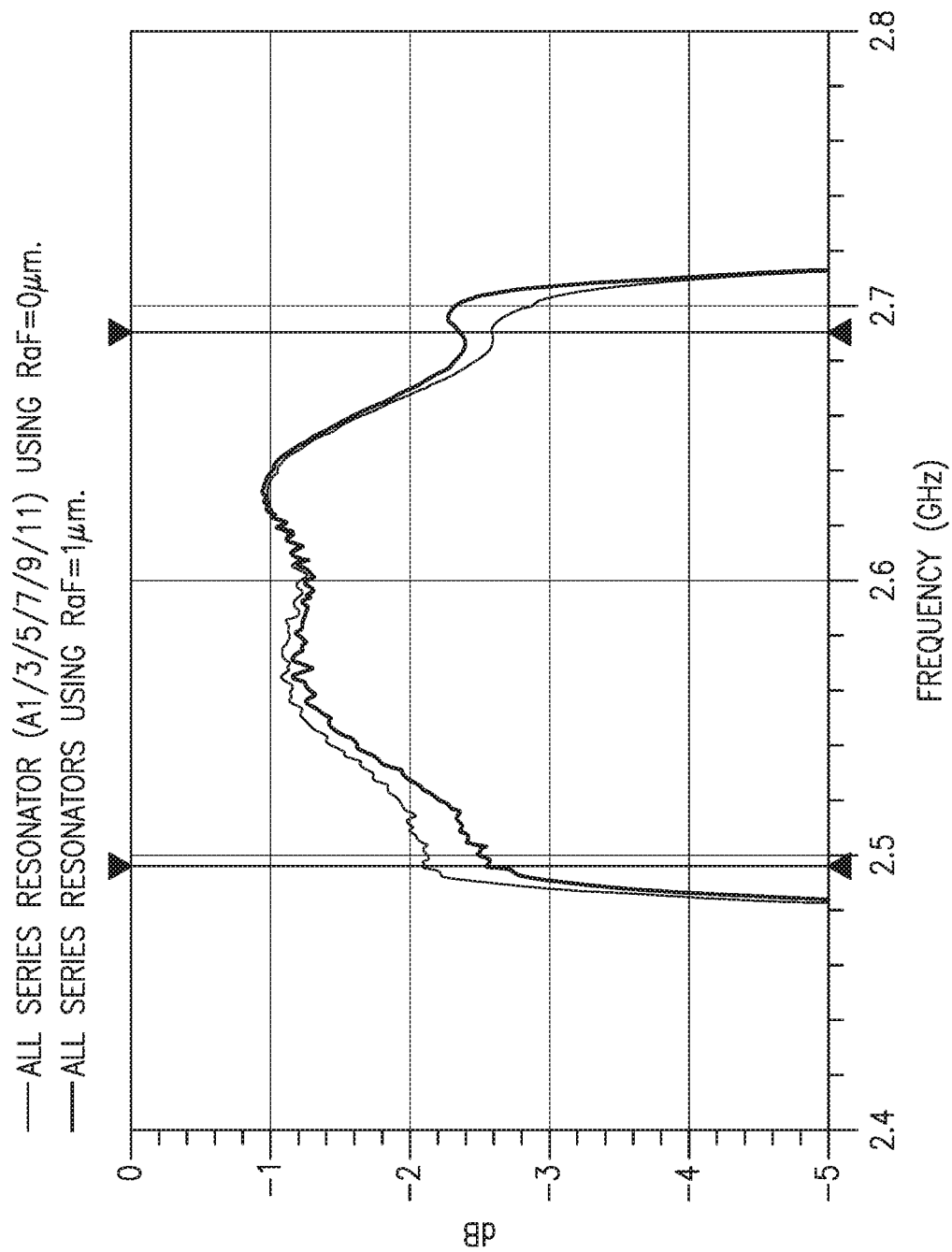

In some implementations, only a subset of the series resonators in a ladder filter may lack raised frame regions. FIGS. 6A-6F illustrates how the passband of a filter configured as illustrated in FIG. 2 changes as different series resonators are configured to include raised frame regions with widths of 1 μm. As can be seen in these figures, as more series resonators are provided with raised frame regions, the insertion loss at the lower end of the passband decreases, but the insertion loss at the upper end of the passband increases. One may select a suitable number of series resonators in a ladder filter to include and to not include raised frame regions to achieve a passband having a desired shape. For example, as illustrated in FIG. 6D, providing series resonators A1, A3, A5, and A7 with raised frame regions 1 μm in width while the remainder of the series resonators lack raised frame regions, the insertion loss at the upper and lower sides of the passband are approximately equal.

Figure 7A:
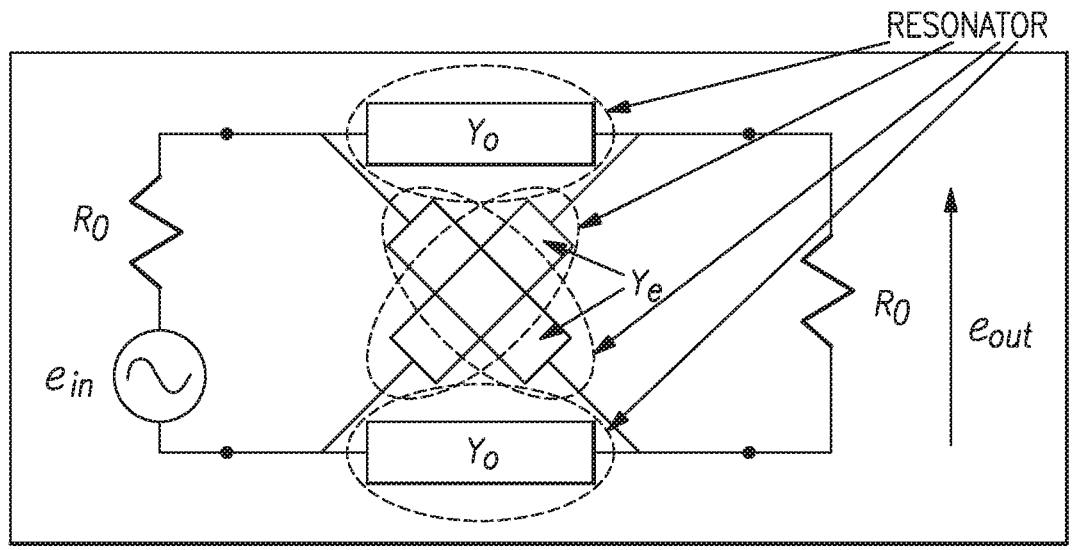
FIG. 7A illustrates an example of a lattice filter.
Figure 7B:
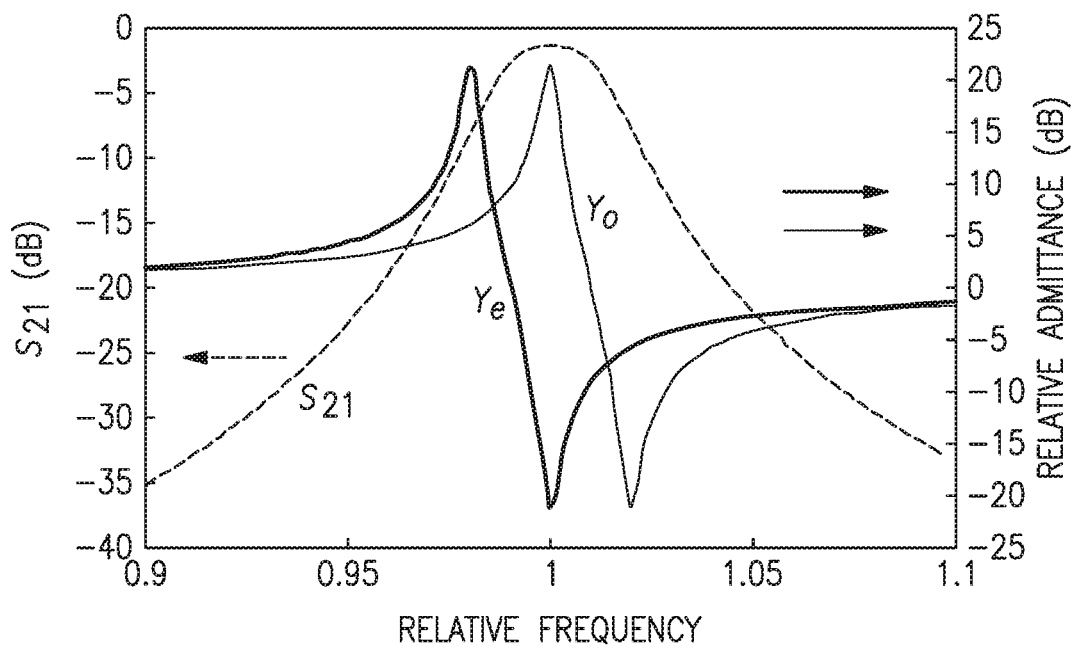
FIG. 7B illustrates frequency response of an example of lattice filter.

Resonators as disclosed herein may be utilized not only in ladder filters, but also in other forms of filters, for example, lattice filters or band rejection/notch filters. One example of a lattice filter configuration is illustrated in FIG. 7A. An example of frequency response of a lattice filter is illustrated in FIG. 7B. In examples of lattice filters or notch filters disclosed herein, each of the resonators in a filter may be formed without raised frame regions, for example, in implementations in which it is important to minimize insertion loss at the lower side of the passband. In other implementations, the parallel resonators ($Y_e$ for the lattice filter illustrated in FIG. 7A) may include raised frame regions, but one or more of the series resonators ($Y_O$ for the lattice filter illustrated in FIG. 7A) may be formed without raised frame regions, for example, in implementations in which it is important to minimize insertion loss at the upper side of the passband.

Figure 8A:
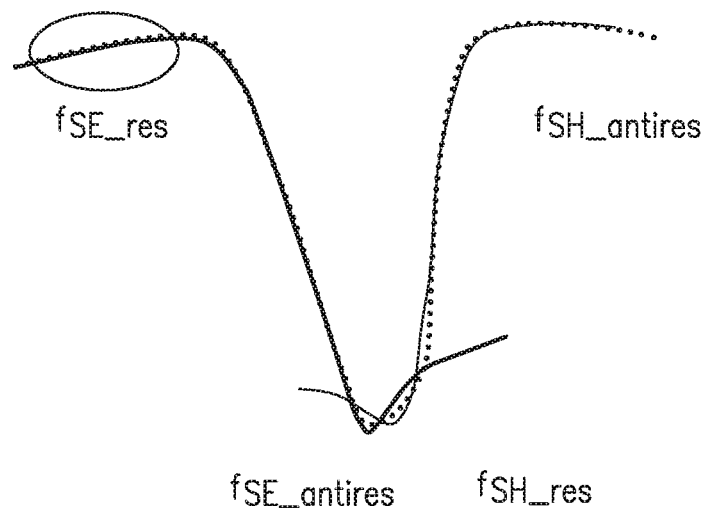
FIG. 8A illustrates the frequency response of series and shunt resonators in an example of a notch filter.
Figure 8B:
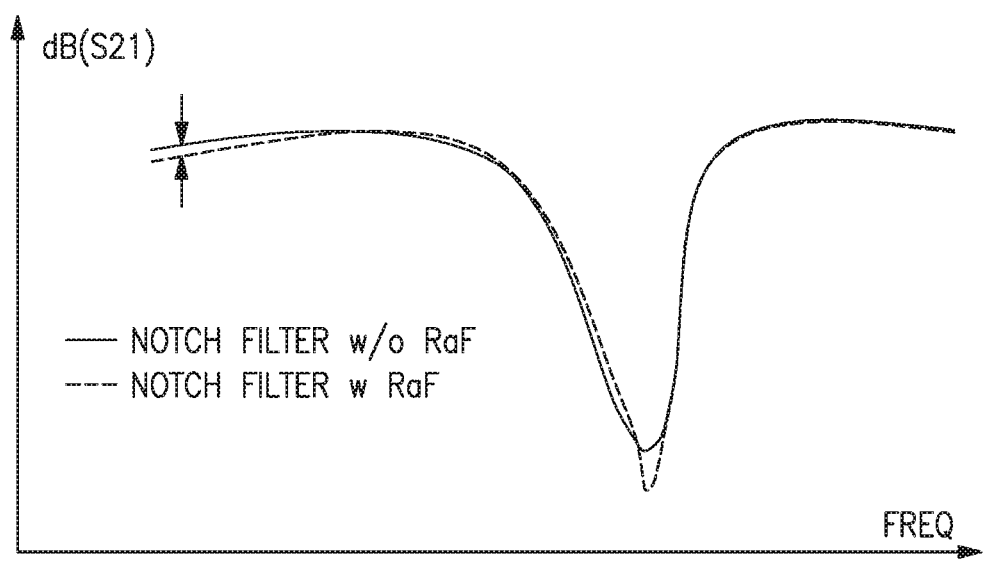
FIG. 8B illustrates the frequency response of a notch filter formed with resonators including raised frame regions as compared to the frequency response of a notch filter formed with resonators lacking raised frame regions.

The frequency response and relative locations of the resonant frequency for series resonators ($f_{SE\_res}$), anti-resonant frequency for series resonators ($f_{SE\_antires}$), resonant frequency for shunt resonators ($f_{SH\_res}$), and anti-resonant frequency for shunt resonators ($f_{SE\_antires}$) in an example of a notch filter are illustrated in FIG. 8A. A comparison between the frequency responses of a notch filter utilizing resonators with raised frame regions and without raised frame regions is illustrated in FIG. 8B. It can be seen that a notch filter formed with resonators including raised frame regions may have a sharper notch than a notch filter formed with resonators lacking including raised frame regions, but at the expense of a slightly lower admittance at frequencies below the notch.

Figure 9B:
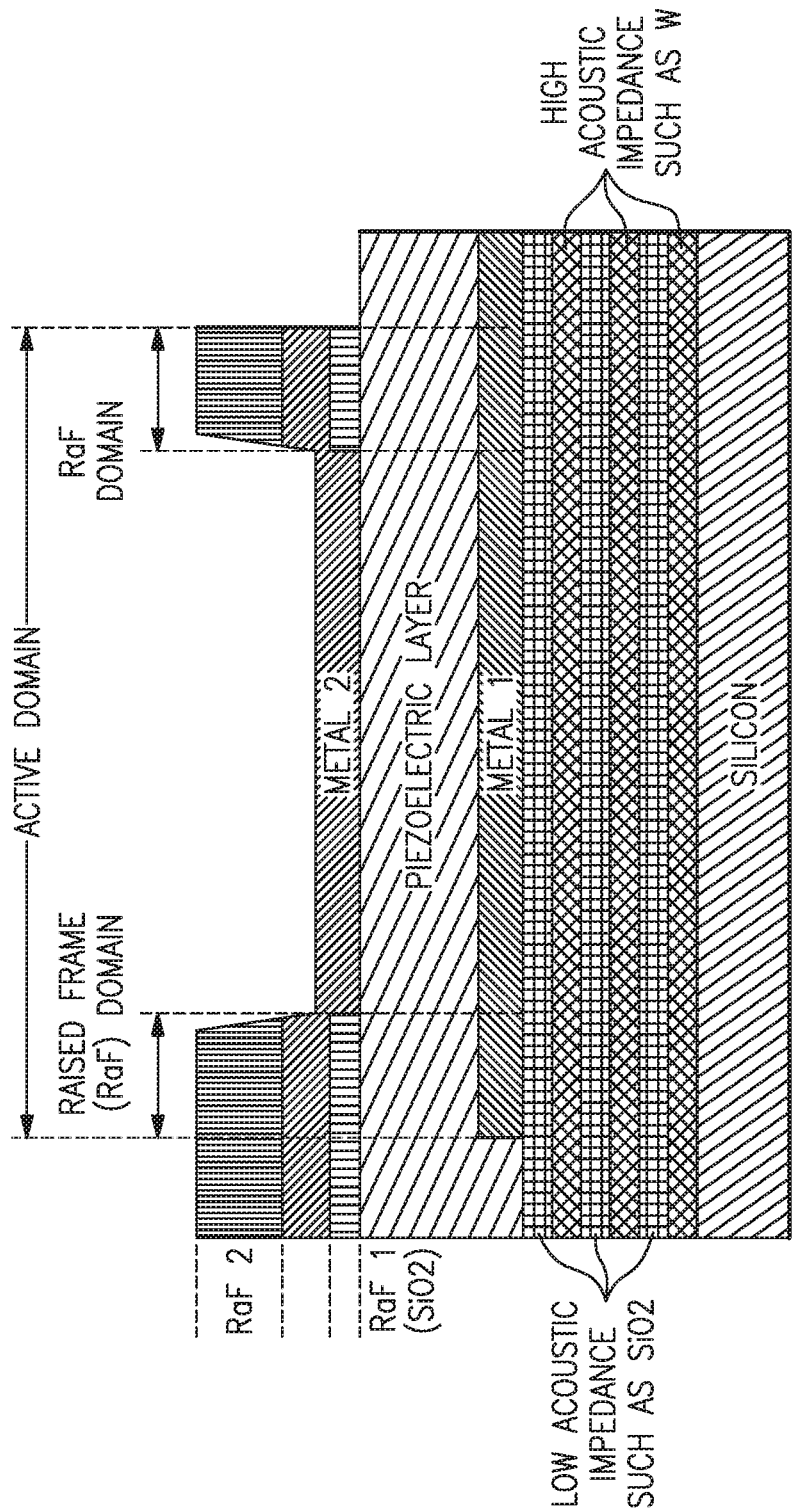
FIG. 9B is a cross-sectional view of another example of a solidly mounted resonator.
Figure 9C:
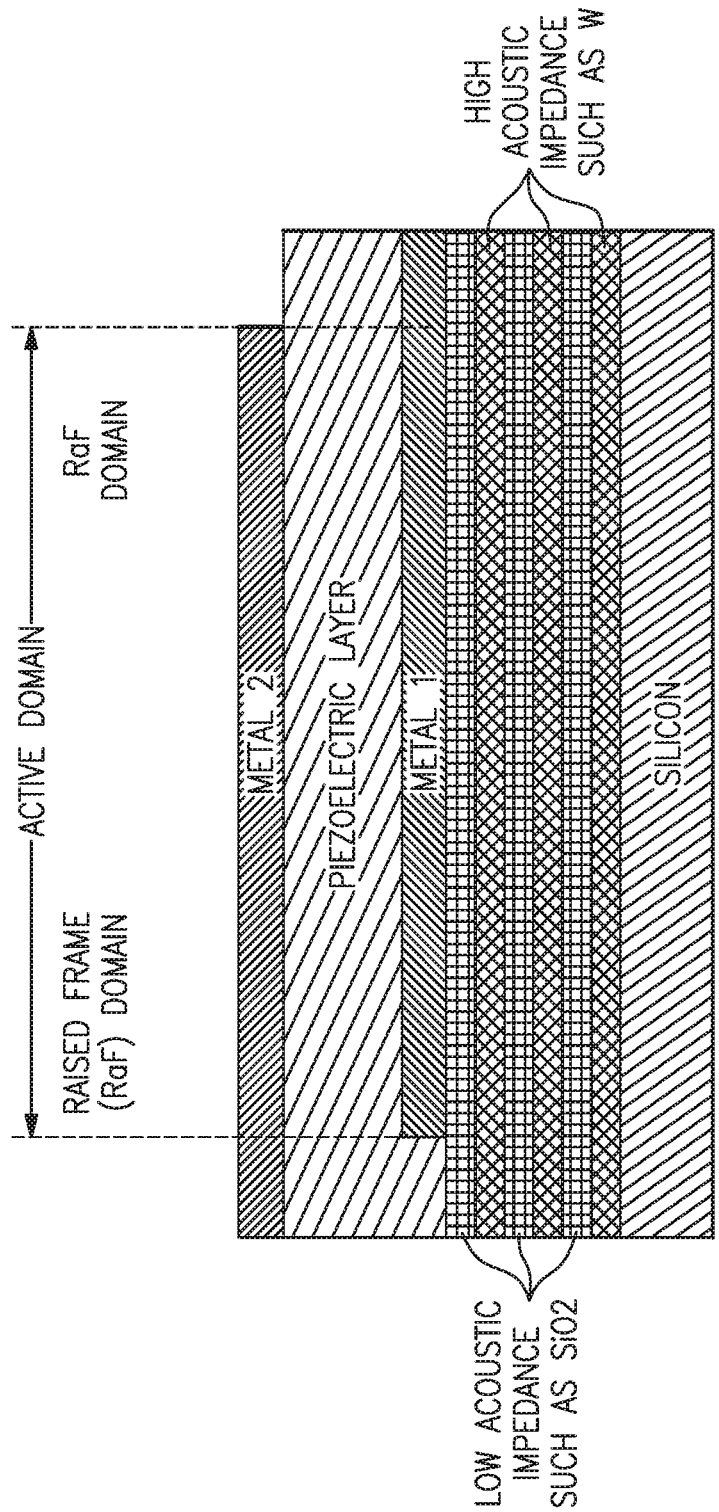
FIG. 9C is a cross-sectional view of another example of a solidly mounted resonator.

Although bulk acoustic wave resonators in the form of film bulk acoustic wave resonators have been discussed above, it is to be appreciated that aspects and embodiments of filters as disclosed herein may include one or more bulk acoustic wave resonators in the form of a solidly mounted resonator (SMR). In some embodiments, a filter, for example a radio frequency ladder filter, may include only SMRs and no FBARs or a combination of SMRs and FBARs. One or more of the SMRs as disclosed herein that may be used in a filter may include a raised frame, for example, as illustrated in FIGS. 9A and 9B, or may have a raised frame with a lesser width or height than other SMRs used in a filter, or no raised frame at all, for example, as illustrated in FIG. 9C. As illustrated in FIGS. 9A-9C embodiments of SMRs disclosed herein may include a piezoelectric layer formed of, for example, aluminum nitride or another suitable piezoelectric material, an upper electrode (the metal 2 layer in FIGS. 9A-9C) disposed on an upper surface of the piezoelectric layer, and a lower electrode (the metal 1 layer in FIGS. 9A-9C) disposed on lower surface of the piezoelectric layer. The piezoelectric layer and upper and lower electrodes may be disposed on a Bragg reflector formed of alternating layers of a first material with a high acoustic impedance, for example, tungsten, and a second material with a lower acoustic impedance than the first material, for example, $SiO_2$. The Bragg reflector may be mounted on a substrate, for example, a silicon substrate. In SMRs including a raised frame, the raised frame may include a layer of a dielectric material, for example, $SiO_2$ disposed on an upper surface of the upper electrode (the RaF 2 layer illustrated in FIGS. 9A and 9B) in a raised frame domain region of the resonator. Additionally or alternatively, the raised frame may include a layer of a dielectric material, for example, $SiO_2$ (the RaF 1 layer illustrated in FIG. 9B) disposed between the lower surface of the upper electrode and the piezoelectric material in a raised frame domain region of the resonator.

Figure 10:
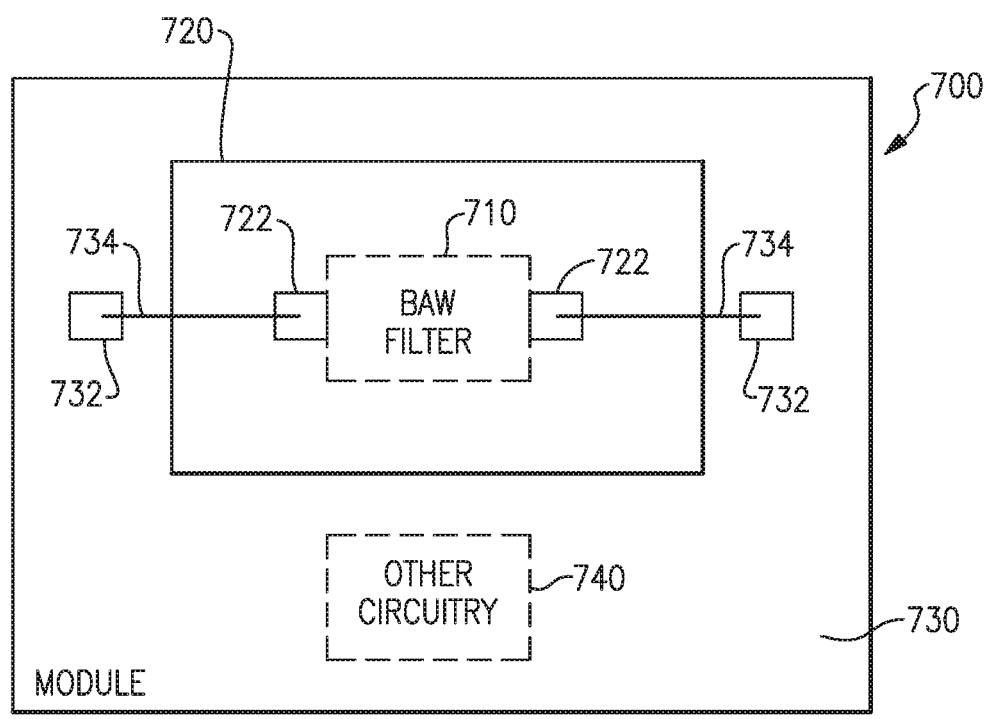
FIG. 10 is a block diagram of one example of a filter module that can include one or more acoustic wave elements according to aspects of the present disclosure.
Figure 11:
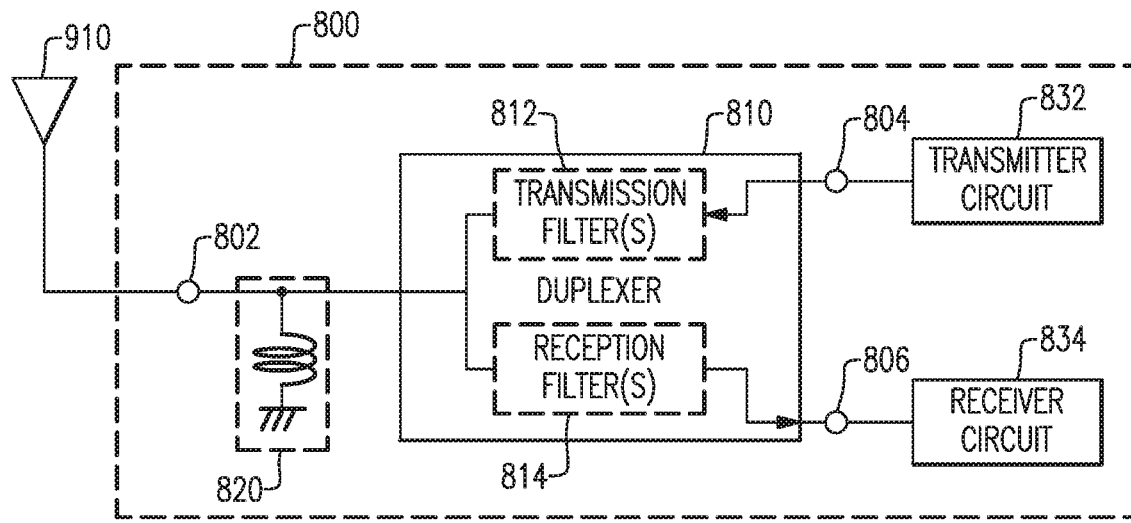
FIG. 11 is a block diagram of one example of a front-end module that can include one or more filter modules according to aspects of the present disclosure.
Figure 12:
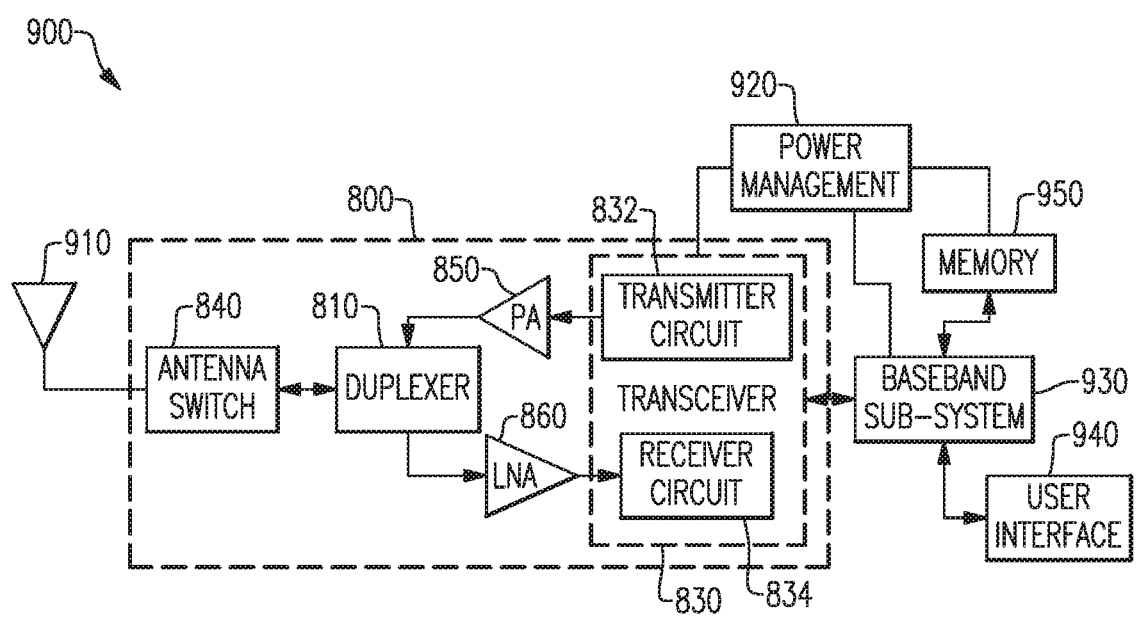
FIG. 12 is a block diagram of one example of a wireless device including the front-end module of FIG. 11.

The acoustic wave devices discussed herein can be implemented in a variety of packaged modules. Some example packaged modules will now be discussed in which any suitable principles and advantages of the packaged acoustic wave devices discussed herein can be implemented. FIGS. 10, 11, and 12 are schematic block diagrams of illustrative packaged modules and devices according to certain embodiments.

As discussed above, embodiments of the disclosed BAW resonators can be configured as or used in filters, for example. In turn, a BAW filter using one or more BAW resonator elements may be incorporated into and packaged as a module that may ultimately be used in an electronic device, such as a wireless communications device, for example. FIG. 10 is a block diagram illustrating one example of a module 700 including a BAW filter 710.

The BAW filter 710 may be implemented on one or more die(s) 720 including one or more connection pads 722. For example, the BAW filter 710 may include a connection pad 722 that corresponds to an input contact for the BAW filter and another connection pad 722 that corresponds to an output contact for the BAW filter. The packaged module 700 includes a packaging substrate 730 that is configured to receive a plurality of components, including the die 720. A plurality of connection pads 732 can be disposed on the packaging substrate 730, and the various connection pads 722 of the BAW filter die 720 can be connected to the connection pads 732 on the packaging substrate 730 via electrical connectors 734, which can be solder bumps or wirebonds, for example, to allow for passing of various signals to and from the BAW filter 710. The module 700 may optionally further include other circuitry die 740, such as, for example one or more additional filter(s), amplifiers, pre-filters, modulators, demodulators, down converters, and the like, as would be known to one of skill in the art of semiconductor fabrication in view of the disclosure herein. In some embodiments, the module 700 can also include one or more packaging structures to, for example, provide protection and facilitate easier handling of the module 700. Such a packaging structure can include an overmold formed over the packaging substrate 730 and dimensioned to substantially encapsulate the various circuits and components thereon.

Various examples and embodiments of the BAW filter 710 can be used in a wide variety of electronic devices. For example, the BAW filter 710 can be used in an antenna duplexer, which itself can be incorporated into a variety of electronic devices, such as RF front-end modules and communication devices.

Referring to FIG. 10, there is illustrated a block diagram of one example of a front-end module 800, which may be used in an electronic device such as a wireless communications device (e.g., a mobile phone) for example. The front-end module 800 includes an antenna duplexer 810 having a common node 802, an input node 804, and an output node 806. An antenna 910 is connected to the common node 802.

The antenna duplexer 810 may include one or more transmission filters 812 connected between the input node 804 and the common node 802, and one or more reception filters 814 connected between the common node 802 and the output node 806. The passband(s) of the transmission filter(s) are different from the passband(s) of the reception filters. Examples of the BAW filter 710 can be used to form the transmission filter(s) 812 and/or the reception filter(s) 814. An inductor or other matching component 820 may be connected at the common node 802.

The front-end module 800 further includes a transmitter circuit 832 connected to the input node 804 of the duplexer 810 and a receiver circuit 834 connected to the output node 806 of the duplexer 810. The transmitter circuit 832 can generate signals for transmission via the antenna 910, and the receiver circuit 834 can receive and process signals received via the antenna 910. In some embodiments, the receiver and transmitter circuits are implemented as separate components, as shown in FIG. 11, however in other embodiments these components may be integrated into a common transceiver circuit or module. As will be appreciated by those skilled in the art, the front-end module 800 may include other components that are not illustrated in FIG. 11 including, but not limited to, switches, electromagnetic couplers, amplifiers, processors, and the like.

FIG. 12 is a block diagram of one example of a wireless device 900 including the antenna duplexer 810 shown in FIG. 11. The wireless device 900 can be a cellular phone, smart phone, tablet, modem, communication network or any other portable or non-portable device configured for voice or data communication. The wireless device 900 can receive and transmit signals from the antenna 910. The wireless device includes an embodiment of a front-end module 800 similar to that discussed above with reference to FIG. 11. The front-end module 800 includes the duplexer 810, as discussed above. In the example shown in FIG. 12 the front-end module 800 further includes an antenna switch 840, which can be configured to switch between different frequency bands or modes, such as transmit and receive modes, for example. In the example illustrated in FIG. 12, the antenna switch 840 is positioned between the duplexer 810 and the antenna 910; however, in other examples the duplexer 810 can be positioned between the antenna switch 840 and the antenna 910. In other examples the antenna switch 840 and the duplexer 810 can be integrated into a single component.

The front-end module 800 includes a transceiver 830 that is configured to generate signals for transmission or to process received signals. The transceiver 830 can include the transmitter circuit 832, which can be connected to the input node 804 of the duplexer 810, and the receiver circuit 834, which can be connected to the output node 806 of the duplexer 810, as shown in the example of FIG. 11.

Signals generated for transmission by the transmitter circuit 832 are received by a power amplifier (PA) module 850, which amplifies the generated signals from the transceiver 830. The power amplifier module 850 can include one or more power amplifiers. The power amplifier module 850 can be used to amplify a wide variety of RF or other frequency-band transmission signals. For example, the power amplifier module 850 can receive an enable signal that can be used to pulse the output of the power amplifier to aid in transmitting a wireless local area network (WLAN) signal or any other suitable pulsed signal. The power amplifier module 850 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 850 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 12, the front-end module 800 may further include a low noise amplifier module 860, which amplifies received signals from the antenna 910 and provides the amplified signals to the receiver circuit 834 of the transceiver 830.

The wireless device 900 of FIG. 12 further includes a power management sub-system 920 that is connected to the transceiver 830 and manages the power for the operation of the wireless device 900. The power management system 920 can also control the operation of a baseband sub-system 930 and various other components of the wireless device 900. The power management system 920 can include, or can be connected to, a battery (not shown) that supplies power for the various components of the wireless device 900. The power management system 920 can further include one or more processors or controllers that can control the transmission of signals, for example. In one embodiment, the baseband sub-system 930 is connected to a user interface 940 to facilitate various input and output of voice and/or data provided to and received from the user. The baseband sub-system 930 can also be connected to memory 950 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A ladder filter comprising:
an input port and an output port;
a plurality of series arm bulk acoustic wave resonators electrically connected in series between the input port and the output port; and
a plurality of shunt bulk acoustic wave resonators connected in parallel, each of the shunt bulk acoustic wave resonators being electrically connected between respective adjacent ones of the plurality of series arm bulk acoustic wave resonators and ground, each of the plurality of series arm bulk acoustic wave resonators and the plurality of shunt bulk acoustic wave resonators including a film of piezoelectric material, an upper electrode disposed on top of the film of piezoelectric material, and a layer of dielectric material disposed on top of the upper electrode in each of a central active region and a recessed frame region, the central active region being surrounded by the recessed frame region in each respective resonator of the plurality of series arm bulk acoustic wave resonators and the plurality of shunt bulk acoustic wave resonators, a combined thickness of the upper electrode and layer of dielectric material being greater in the central active region of each respective resonator than in the recessed frame region, a raised frame region including the film of piezoelectric material, the upper electrode disposed on top of the film of piezoelectric material, and the layer of dielectric material disposed on top of the upper electrode surrounding the recessed frame region in at least one of the plurality of shunt bulk acoustic wave resonators, the combined thickness of the upper electrode and layer of dielectric material being greater in the raised frame region than in the central active region, the raised frame region having a first width, and at least one of the plurality of series arm bulk acoustic wave resonators lacking any raised frame region, the at least one of the plurality of series arm bulk acoustic wave resonators including a third region surrounding the recessed frame region, the third region including the upper electrode disposed on top of the film of piezoelectric material and the layer of dielectric material disposed on top of the upper electrode, the layer of dielectric material being thinner in the recessed frame region than in the central region and thicker in the third region than in the recessed frame region.

2. The ladder filter of claim 1 wherein the plurality of series arm bulk acoustic wave resonators are each film bulk acoustic wave resonators.

3. The ladder filter of claim 2 wherein the plurality of shunt bulk acoustic wave resonators are each film bulk acoustic wave resonators.

4. The ladder filter of claim 3 wherein in each of the plurality of series arm film bulk acoustic wave resonators and each of the plurality of shunt film bulk acoustic wave resonators the central region defines a main active domain in which a main acoustic wave is generated during operation.

5. The ladder filter of claim 3 wherein each of the plurality of series arm film bulk acoustic wave resonators have a same resonant frequency.

6. The ladder filter of claim 5 wherein each of the plurality of shunt film bulk acoustic wave resonators have a resonant frequency below the resonant frequency of each of the plurality of series arm film bulk acoustic wave resonators.

7. The ladder filter of claim 6 wherein at least one of the plurality of shunt film bulk acoustic wave resonators has a first resonant frequency different from resonant frequencies of others of the plurality of shunt film bulk acoustic wave resonators.

8. The ladder filter of claim 4 wherein each of the plurality of shunt film bulk acoustic wave resonators include a raised frame region disposed on opposite sides of the recessed frame region from the central region.

9. The ladder filter of claim 8 wherein the raised frame region of each of the plurality of shunt film bulk acoustic wave resonators have approximately a same width.

10. The ladder filter of claim 8 wherein at least one of the plurality of shunt film bulk acoustic wave resonators has a raised frame region with a width less than a width of raised frame regions of others of the plurality of shunt film bulk acoustic wave resonators.

11. The ladder filter of claim 3 wherein each of the plurality of series arm film bulk acoustic wave resonators lack raised frame regions.

12. The ladder filter of claim 1 exhibiting a greater insertion loss at an upper end of a passband of the ladder filter than at a lower end of the passband of the ladder filter.

13. The ladder filter of claim 12 wherein the passband is greater than about 200 MHz in width.

14. The ladder filter of claim 12 wherein the ladder filter exhibits a relative passband width wider than 5.5%, the relative passband width being defined as the filter bandwidth divided by the filter center frequency.

15. The ladder filter of claim 1 wherein the plurality of series arm bulk acoustic wave resonators includes at least one solidly mounted resonator.

16. The ladder filter of claim 15 wherein the plurality of shunt bulk acoustic wave resonators includes at least one solidly mounted resonator.

17. The ladder filter of claim 7 wherein at least one of the plurality of shunt film bulk acoustic wave resonators has a second resonant frequency different from the first resonant frequency and different from the resonant frequencies of others of the plurality of shunt film bulk acoustic wave resonators.

18. The ladder filter of claim 1 having a passband in a radio frequency band.

19. A ladder filter comprising:
an input port and an output port;
a plurality of series arm bulk acoustic wave resonators electrically connected in series between the input port and the output port; and
a plurality of shunt bulk acoustic wave resonators connected in parallel, each of the shunt bulk acoustic wave resonators being electrically connected between respective adjacent ones of the plurality of series arm bulk acoustic wave resonators and ground, each of the plurality of series arm bulk acoustic wave resonators and the plurality of shunt bulk acoustic wave resonators including a film of piezoelectric material, an upper electrode disposed on top of the film of piezoelectric material, and a layer of dielectric material disposed on top of the upper electrode in each of a central active region, a recessed frame region, and a raised frame region the layer of dielectric material being thinner in the recessed frame region than in the central region and thicker in the raised frame region than in the recessed frame region, the central active region being surrounded by the recessed frame region and the raised frame region surrounding the recessed frame region in each respective resonator of the plurality of series arm bulk acoustic wave resonators and the plurality of shunt bulk acoustic wave resonators, a combined thickness of the upper electrode and layer of dielectric material being greater in the central active region of each respective resonator than in the recessed frame region, the combined thickness of the upper electrode and layer of dielectric material being greater in the raised frame region than in the central active region, at least one of the plurality of shunt bulk acoustic wave resonators including a raised frame region having a first width, and at least one of the plurality of series arm bulk acoustic wave resonators including a raised frame region having a second width less than the first width.

20. The ladder filter of claim 19 wherein the plurality of series arm bulk acoustic wave resonators includes at least one film bulk acoustic wave resonator.

21. The ladder filter of claim 20 wherein the plurality of shunt bulk acoustic wave resonators includes at least one film bulk acoustic wave resonator.

22. The ladder filter of claim 19 wherein the plurality of series arm bulk acoustic wave resonators includes at least one solidly mounted resonator.

23. The ladder filter of claim 22 wherein the plurality of shunt bulk acoustic wave resonators includes at least one solidly mounted resonator.

24. An electronics module comprising a radio frequency ladder filter including:
a plurality of series arm film bulk acoustic wave resonators electrically connected in series between an input port and an output port of the ladder filter; and
a plurality of shunt film bulk acoustic wave resonators electrically connected in parallel between adjacent ones of the plurality of series arm film bulk acoustic wave resonators and ground, each of the plurality of series arm bulk acoustic wave resonators and the plurality of shunt bulk acoustic wave resonators including a film of piezoelectric material, an upper electrode disposed on top of the film of piezoelectric material, and a layer of dielectric material disposed on top of the upper electrode in each of a central active region, a recessed frame region, and a raised frame region, the layer of dielectric material being thinner in the recessed frame region than in the central region and thicker in the raised frame region than in the recessed frame region, the central active region being surrounded by the recessed frame region and the raised frame region surrounding the recessed frame region in each respective resonator of the plurality of series arm bulk acoustic wave resonators and the plurality of shunt bulk acoustic wave resonators, a combined thickness of the upper electrode and layer of dielectric material being greater in the central active region of each respective resonator than in the recessed frame region, at least one of the plurality of shunt film bulk acoustic wave resonators including a raised frame region including the film of piezoelectric material, the upper electrode disposed on top of the film of piezoelectric material, and the layer of dielectric material disposed on top of the upper electrode surrounding the recessed frame region and having a first width, the combined thickness of the upper electrode and layer of dielectric material being greater in the raised frame region than in the central active region, at least one of the plurality of series arm film bulk acoustic wave resonators having a raised frame region having a second width less than the first width.

25. An electronic device comprising an electronics module including a radio frequency ladder filter having:
a plurality of series arm film bulk acoustic wave resonators electrically connected in series between an input port and an output port of the ladder filter; and
a plurality of shunt film bulk acoustic wave resonators electrically connected in parallel between adjacent ones of the plurality of series arm film bulk acoustic wave resonators and ground, each of the plurality of series arm bulk acoustic wave resonators and the plurality of shunt bulk acoustic wave resonators including a film of piezoelectric material, an upper electrode disposed on top of the film of piezoelectric material, and a layer of dielectric material disposed on top of the upper electrode in each of a central active region and a recessed frame region, the central active region being surrounded by the recessed frame region in each respective resonator of the plurality of series arm bulk acoustic wave resonators and the plurality of shunt bulk acoustic wave resonators, a combined thickness of the upper electrode and layer of dielectric material being greater in the central active region of each respective resonator than in the recessed frame region, at least one of the plurality of shunt film bulk acoustic wave resonators including a raised frame region including the film of piezoelectric material, the upper electrode disposed on top of the film of piezoelectric material, and the layer of dielectric material disposed on top of the upper electrode surrounding the recessed frame region and having a first width, the combined thickness of the upper electrode and layer of dielectric material being greater in the raised frame region than in the central active region, the layer of dielectric material being thinner in the recessed frame region than in the central region and thicker in the raised frame region than in the recessed frame region, at least one of the plurality of series arm film bulk acoustic wave resonators having one of a raised frame region having a second width less than the first width or lacking any raised frame region.

26. A film bulk acoustic wave resonator comprising a piezoelectric film, an upper electrode disposed on top of the piezoelectric film, and a layer of dielectric material disposed on top of the upper electrode in each of a central region, in a recessed frame region circumscribing the central region, and in a third region circumscribing the recessed frame region, the central region defining a main active domain in which a main acoustic wave is generated during operation, a combined thickness of the upper electrode and layer of dielectric material being greater in the central region than in the recessed frame region, the layer of dielectric material being thinner in the recessed frame region than in the central region and thicker in the third region than in the recessed frame region, the film bulk acoustic wave resonator lacking any raised frame region.

27. A radio frequency filter comprising a film bulk acoustic wave resonator including a piezoelectric film, an upper electrode disposed on top of the piezoelectric film, and a layer of dielectric material disposed on top of the upper electrode in each of a central region, in a recessed frame region circumscribing the central region, and in a third region circumscribing the recessed frame region, the central region defining a main active domain in which a main acoustic wave is generated during operation, a combined thickness of the upper electrode and layer of dielectric material being greater in the central region than in the recessed frame region, the layer of dielectric material being thinner in the recessed frame region than in the central region and thicker in the third region than in the recessed frame region, the film bulk acoustic wave resonator lacking any raised frame region.

28. An electronics module comprising a radio frequency filter including a film bulk acoustic wave resonator having a piezoelectric film, an upper electrode disposed on top of the piezoelectric film, and a layer of dielectric material disposed on top of the upper electrode in each of a central region in a recessed frame region circumscribing the central region, and in a third region circumscribing the recessed frame region, the central region defining a main active domain in which a main acoustic wave is generated during operation, a combined thickness of the upper electrode and layer of dielectric material being greater in the central region than in the recessed frame region, the layer of dielectric material being thinner in the recessed frame region than in the central region and thicker in the third region than in the recessed frame region, the film bulk acoustic wave resonator lacking any raised frame region.

29. An electronic device comprising an electronics module including a radio frequency filter having a film bulk acoustic wave resonator with a piezoelectric film, an upper electrode disposed on top of the piezoelectric film, and a layer of dielectric material disposed on top of the upper electrode in each of a central region in a recessed frame region circumscribing the central region, and in a third region circumscribing the recessed frame region, the central region defining a main active domain in which a main acoustic wave is generated during operation, a combined thickness of the upper electrode and layer of dielectric material being greater in the central region than in the recessed frame region, the layer of dielectric material being thinner in the recessed frame region than in the central region and thicker in the third region than in the recessed frame region, the film bulk acoustic wave resonator lacking any raised frame region.

* * * * *

UNITED STATES PATENT AND TRADEMARK OFFICE
CERTIFICATE OF CORRECTION

PATENT NO. : 11,601,113 B2
APPLICATION NO. : 16/881285
DATED : March 7, 2023
INVENTOR(S) : Yiliu Wang et al.

It is certified that error appears in the above-identified patent and that said Letters Patent is hereby corrected as shown below:

On the Title Page

Item (72) Inventors: delete "Yiliu Wang, Irvine, CA (US); Yasufumi Kaneda, Yokohama (JP); Xianyi Li, Irvine, CA (US); Kwang Jae Shin, Yongin (KR); Stephane Richard Marie Wloczysiak, Irvine, CA (US); Jiansong Liu, Irvine, CA (US); Nan Wu, Irvine, CA (US)" and insert -- Yiliu Wang, Irvine, CA (US); Yasufumi Kaneda, Yokohama-Shi (JP); Xianyi Li, Irvine, CA (US); Kwang Jae Shin, Yongin (KR); Stephane Richard Marie Wloczysiak, Irvine, CA (US); Jiansong Liu, Irvine, CA (US); Nan Wu, Irvine, CA (US) --

Signed and Sealed this
Sixteenth Day of May, 2023

Katherine Kelly Vidal
*Director of the United States Patent and Trademark Office*